(12) United States Patent
Huang et al.

(10) Patent No.: US 9,536,980 B1
(45) Date of Patent: Jan. 3, 2017

(54) GATE SPACERS AND METHODS OF FORMING SAME

(71) Applicant: Taiwan Semiconductor Manufacturing Company, Ltd., Hsin-Chu (TW)

(72) Inventors: Yuan-Sheng Huang, Taichung (TW); Chao-Cheng Chen, Hsin-Chu (TW); Chun-Hung Lee, Hsin-Chu (TW); Hua Feng Chen, Hsin-Chu (TW); Po-Hsueh Li, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/811,411

(22) Filed: Jul. 28, 2015

(51) Int. Cl.
    *H01L 29/66* (2006.01)
    *H01L 29/78* (2006.01)
    *H01L 29/417* (2006.01)
    *H01L 21/768* (2006.01)
    *H01L 21/311* (2006.01)

(52) U.S. Cl.
    CPC ..... *H01L 29/6656* (2013.01); *H01L 21/31144* (2013.01); *H01L 21/76802* (2013.01); *H01L 21/76877* (2013.01); *H01L 29/41725* (2013.01); *H01L 29/66545* (2013.01); *H01L 29/78* (2013.01)

(58) Field of Classification Search
    CPC ............ H01L 29/6656; H01L 21/31144; H01L 21/76877; H01L 29/41725; H01L 29/66545; H01L 29/78; H01L 21/76802
    See application file for complete search history.

(56) References Cited

U.S. PATENT DOCUMENTS

| | | | |
|---|---|---|---|
| 7,615,427 B2 | 11/2009 | Lee et al. | |
| 7,667,271 B2 | 2/2010 | Yu et al. | |
| 7,910,453 B2 | 3/2011 | Xu et al. | |
| 8,084,311 B1 * | 12/2011 | Horak | H01L 21/76897 438/183 |
| 8,377,779 B1 | 2/2013 | Wang | |
| 8,399,931 B2 | 3/2013 | Liaw et al. | |
| 8,481,415 B2 | 7/2013 | Yuan et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |

(Continued)

*Primary Examiner* — Julio J Maldonado
*Assistant Examiner* — Farun Lu
(74) *Attorney, Agent, or Firm* — Slater Matsil, LLP

(57) ABSTRACT

An embodiment device includes a gate stack extending over a semiconductor substrate, a hard mask disposed on a top surface of the gate stack, and a low-k dielectric spacer on a side of the gate stack. A top of the low-k dielectric spacer is lower than an upper surface of the hard mask. The device further includes a contact electrically connected to a source/drain region adjacent the gate stack. The contact extends laterally over the low-k dielectric spacer, and a dielectric material is disposed between the contact and the low-k dielectric spacer. The dielectric material has a higher selectivity to etching than the low-k dielectric spacer.

20 Claims, 26 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2011/0062501 A1* | 3/2011 | Soss .................. H01L 21/28114 257/288 |
| 2013/0270655 A1* | 10/2013 | Adam ............... H01L 29/66545 257/410 |
| 2014/0001574 A1 | 1/2014 | Chen et al. |
| 2014/0110755 A1 | 4/2014 | Colinge |
| 2014/0151812 A1 | 6/2014 | Liaw |
| 2015/0021683 A1* | 1/2015 | Xie ..................... H01L 29/6653 257/330 |
| 2015/0236113 A1* | 8/2015 | Song .................. H01L 29/4983 257/411 |

\* cited by examiner

GATE SPACERS AND METHODS OF FORMING SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
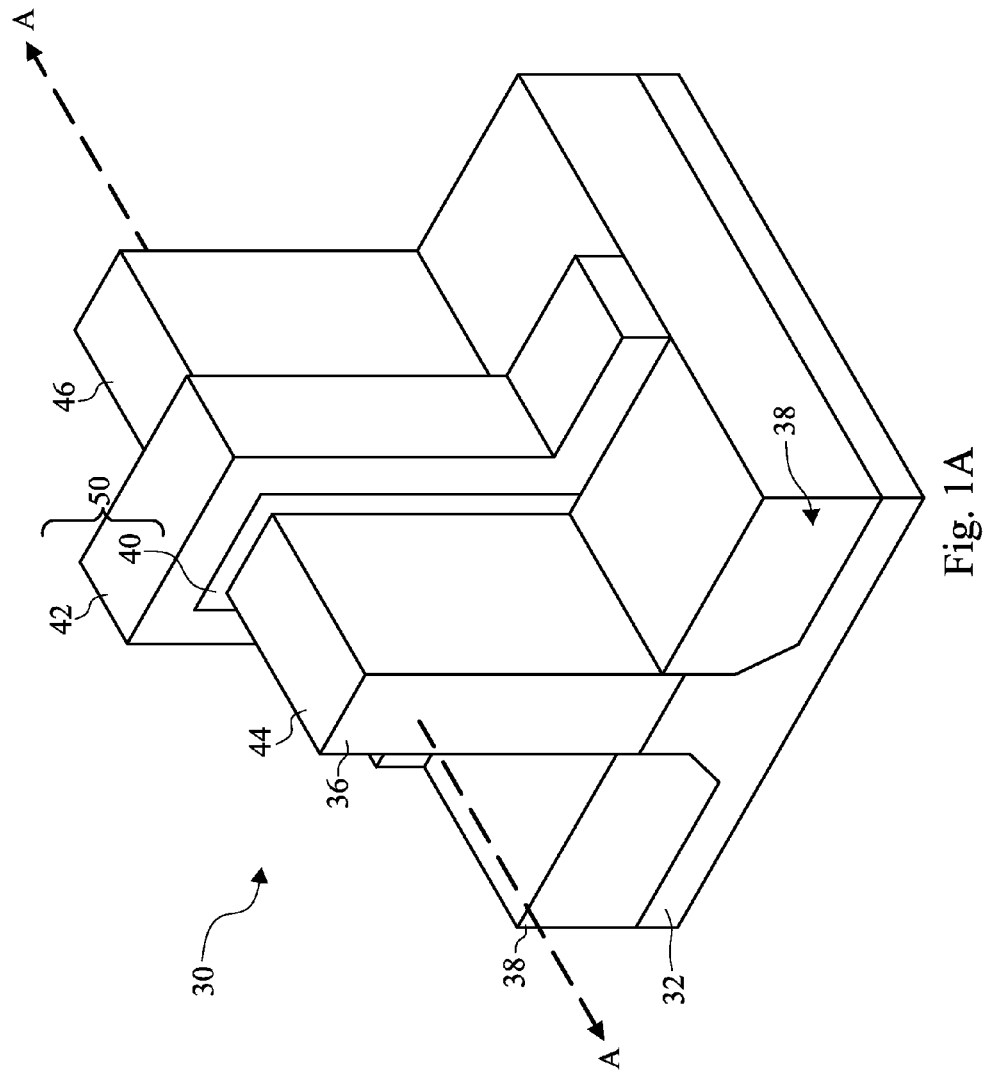
FIGS. 1A through 1D illustrate varying views of semiconductor devices in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described with respect to a particular context, namely fin field-effect transistors (FinFETs). Various embodiments may also be applied, however, to other types of transistors such as planar metal-oxide-semiconductor field-effect transistors (MOSFETs) and the like.

Figure 1B:
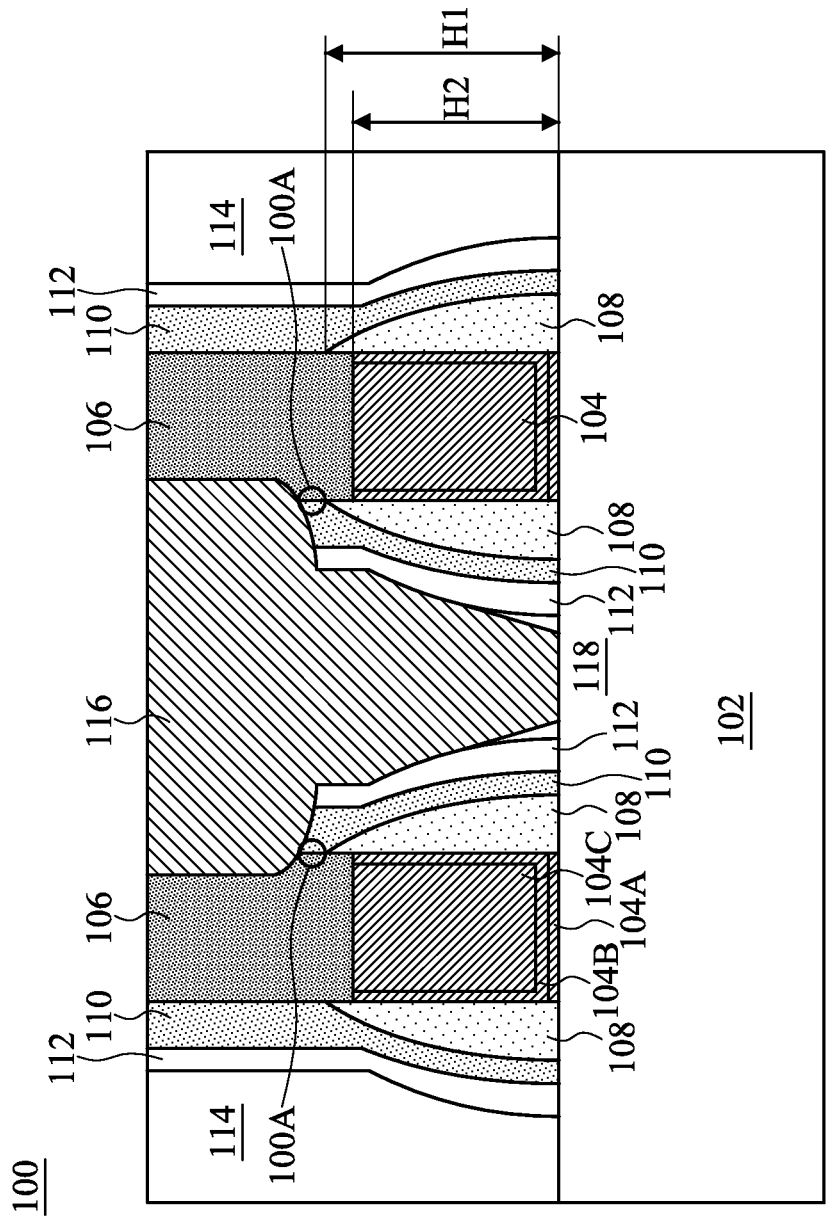

FIG. 1A illustrates an example of a finFET 30 in a three-dimensional view. FinFET 30 includes a semiconductor fin 36 on a semiconductor substrate 32. Substrate 32 includes isolation regions 38, and fin 36 protrudes above and from between neighboring isolation regions 38. A gate dielectric 40 is along sidewalls and over a top surface of fin 36, and a gate electrode 42 is over gate dielectric 40. Gate dielectric 40 and gate electrode 42 make up a gate stack 50 in finFET 30. Portions of fin 36 covered by gate dielectric 40/gate electrode 42 may be referred to as a channel region of finFET 30. Source/drain regions 44 and 46 are disposed in opposite sides of fin 36 with respect to the gate dielectric 40 and gate electrode 42. FIG. 1B further illustrates a reference cross-section A-A taken along a longitudinal axis of fin 36 and in a direction of, for example, a current flow between the source/drain regions 44 and 46. In the cross-sectional views provided in other figures (e.g., FIGS. 1B-1D, 2-11, 12A-12B, and 13-21) may be taken along this reference cross-section A-A.

FIG. 1B illustrates a cross-sectional view of an integrated circuit device 100 according to some embodiments. Device 100 includes gate stacks 104, which may be disposed over and wrapped around a semiconductor fin 102. Fin 102 may extend upwards from an underlying semiconductor substrate (not shown), such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of fin 102 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The material of fin 102 may be the same or different than the material of the underlying substrate.

Gate stacks 104 are formed over and wrap around at least upper portions of fin 102 (e.g., similar to gate stack 50 in FIG. 1B). Gate stacks 104 may include interfacial layers 104A, a gate dielectric 104B, and a conductive gate electrode 104C formed over the gate dielectric. In some embodiments, the gate dielectric comprises a high-k dielectric material having a k-value greater than about 4.0, for example. The conductive gate electrode may include a metal-containing material or other conductive material. Various other layers, such as interfacial layers, work function metals, and the like may also be included in gate stacks 104. The individual layers of gate stacks 104 are not illustrated in subsequent figures for simplicity.

Source/drain regions are formed in portions of the fin not covered by gate stack 104. For example, in device 100, a source/drain region 118 may be disposed in fin 102 between adjacent gate stacks 104. A source/drain contact 116 is formed to extend through an inter-layer dielectric (ILD) 114 to electrically connect to source/drain region 118. ILD 114 may be formed around gate stacks 104, and a top surface of ILD 114 may extend above top surfaces of gate stacks 104. ILD 114 may comprise a low-k dielectric having a k-value less than about 4.0, such as about 2.8 or even less. In some embodiments, ILD 114 comprises a flowable oxide formed using, for example, flowable chemical vapor deposition (FCVD). Contact 116 may comprise a conductive material, such as, tungsten, aluminum, copper, gold, silver, alloys thereof, combinations thereof, and the like. Furthermore various seed and/or barrier layers (not shown) may be formed on sidewalls of contact 116.

As illustrated, contact 116 extends between gate stacks 104 to contact source/drain region 118. As the dimension of various features in IC devices continue to decrease in advanced node technologies, the spacing between adjacent gate stacks 104 may also shrink. Thus, the available space for forming contact 116 may also decrease. As will be described in greater detail in subsequent paragraphs, forming contact 116 may include patterning ILD 114 using photolithography and etching processes. Process restrictions related to etching may require more space than the available spacing between gate stacks 104 can accommodate, and portions of contact 116 may extend laterally over and be aligned with gate stack 104. A hard mask 106 is disposed over each gate stack 104 to prevent damage to gate stack 104 during the formation of contact 116. Hard mask 106 may further be employed to insulate gate stack 104 from contact 116 and prevent an electrical short. In some embodiments, hard masks 106 may include silicon nitride or silicon oxide, for example. In some embodiments, hard mask 106 may be a multilayer comprising, e.g., a nitride layer and an oxide layer. In an embodiment, hard mask 106 comprises a different material than ILD 114 to provide etch selectivity between hard mask 106 and ILD 114.

As further illustrated in FIG. 1A, various spacer layers may be formed adjacent gate stack 104. For example, low-k dielectric spacers 108 are formed on opposing sides of each gate stack 104, and low-k dielectric spacers are positioned between gate stacks 104 and contact 116. Low-k dielectric spacers 108 may comprise a low-k material having a k-value less than about 4.0, such as about 2.8 or even less. For example, in some embodiments spacers 108 may include a porous dielectric material, an extreme low-k (ELK) dielectric material (e.g., SiCO, SiCOH), and the like. Low-k dielectric spacers 108 may or may not include air gaps (not illustrated) to further reduce its k-value. The material of low-k dielectric spacers 108 is used to advantageously reduce parasitic capacitance between gate stacks 104 and contact 116 particularly in advanced node technologies where gate stacks 104 and contact 116 are in close proximity. In various embodiments, low-k dielectric spacers 108 may be at least as high as gate stack 104 to advantageously reduce parasitic capacitance. For example, tops of low-k dielectric spacers 108 may extend above gate stack 104. In an embodiment, tops of low-k dielectric spacers 108 are substantially level with gate stack 104. In another embodiment, tops of low-k dielectric spacers 108 are slightly lower than gate stack 104. In an embodiment, a vertical dimension H1 of low-k dielectric spacer 108 is at least about 95% of a vertical dimension H2 of gate stack over fin 102.

Due to the nature of low-k materials, low-k dielectric spacers 108 may be susceptible to etching and damage during the formation of contact 116. In such embodiments, there is a risk of etching spacers 108 so that contact 116 is formed on gate stack 104, which causes manufacturing defects (e.g., an electrical short). In various embodiments, low-k dielectric spacers 108 may be recessed from a top surface of ILD 114. For example, tops of low-k dielectric spacers 108 may be lower than upper surfaces of hard masks 106. A vertical dimension H1 of low-k dielectric spacers 108 is less than about 105% of a vertical dimension H2 of gate stack over fin 102.

Furthermore, low-k dielectric spacers 108 may be protected from contact 116 by a dielectric material having a higher selectivity to etching than low-k dielectric spacers 108. For example, in device 100, additional spacers are formed between low-k dielectric spacers 108 and contact 116 to prevent damage to low-k dielectric spacers 108. High selectivity spacers 110 are formed on opposing sides of each gate stack 104, and high selectivity spacers 110 are disposed between low-k dielectric spacer 108 and contact 116. Spacers 110 may be disposed between low-k dielectric spacers 108 and contact 116 even in areas (e.g., areas 100A) where contact 116 extends laterally over low-k dielectric spacers 108.

In an embodiment, spacers 110 may comprise silicon nitride although other materials such as oxides, oxynitrides, and the like may also be used. Spacers 110 may comprise a higher dielectric constant than low-k dielectric spacers 108. In another embodiment, spacers 110 may be a multilayer spacer comprising an oxide layer and a nitride layer, for example. Thus, during patterning processes for contact 116, spacers 110 may prevent the etching of underlying spacers 108.

Figure 1C:
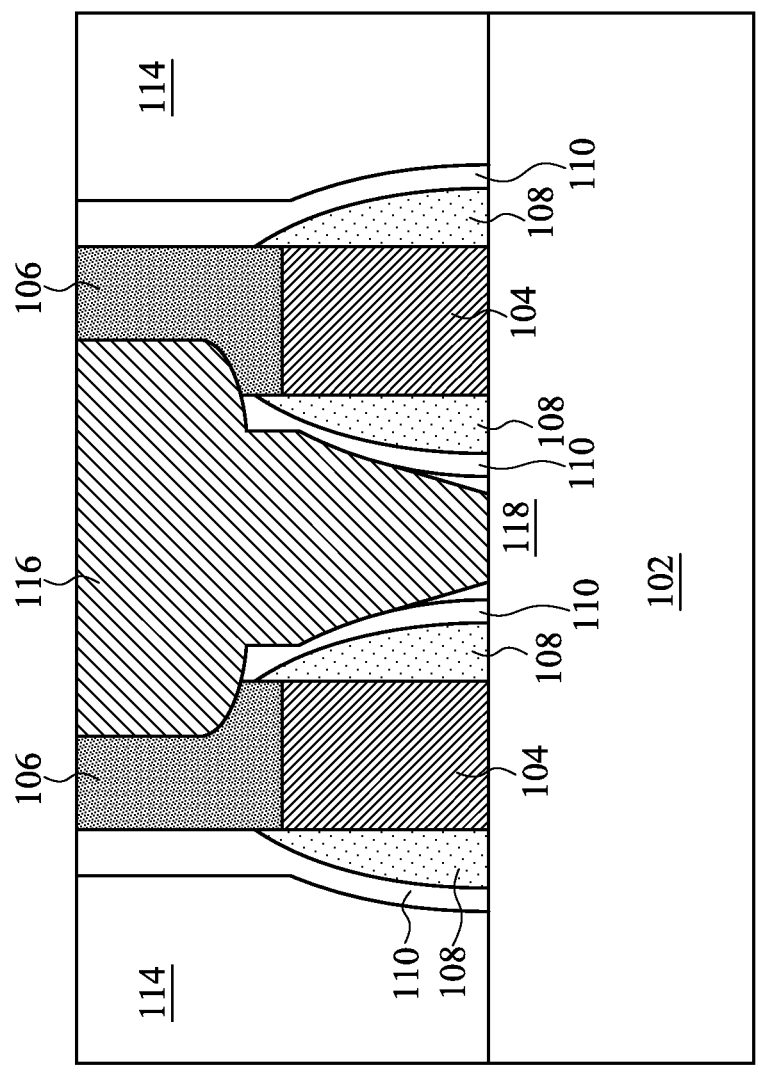
Figure 1D:
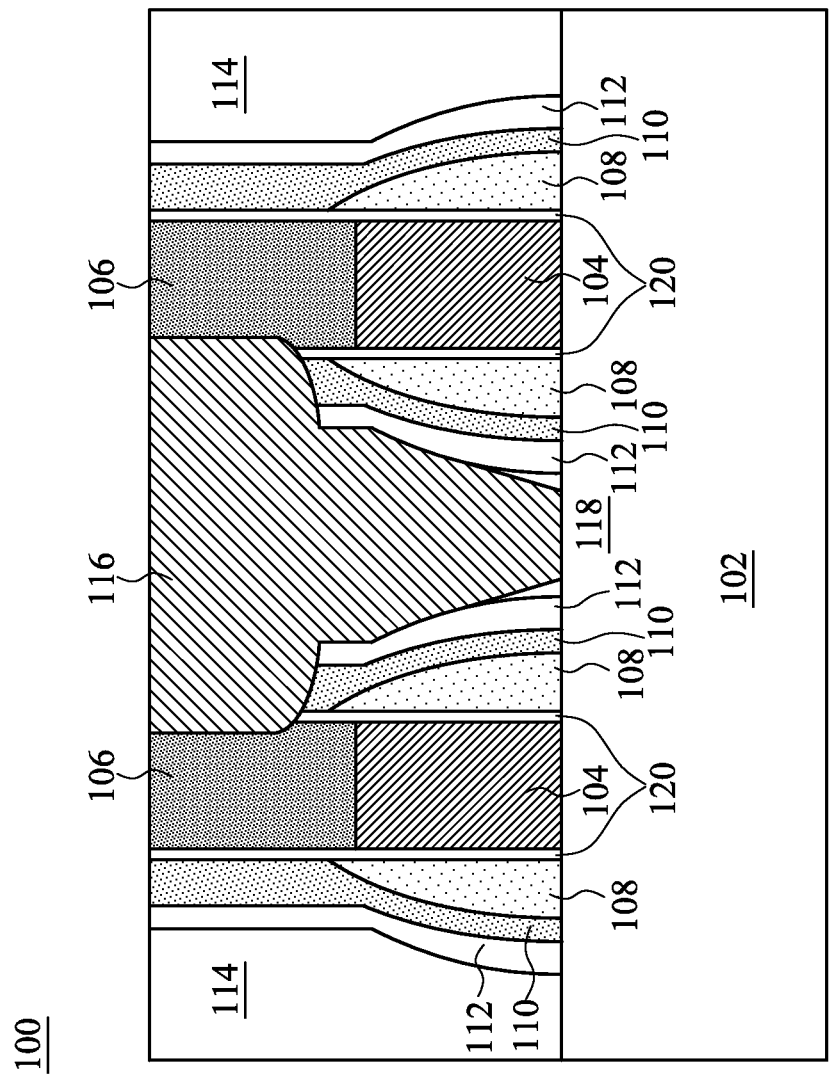

Additional spacer layers may be formed on opposing sides of each gate stack 104 depending on device design. For example, in device 100, spacers 112 are also formed on device 100 to further protect gate stacks 104 and low-k dielectric spacers 108. Spacers 112 may be a single layer spacer or a multilayer spacer. In other embodiments, as illustrated by FIG. 1C, spacers 112 may be omitted. In another embodiment, as illustrated by FIG. 1D, additional layers, such as interfacial layers 120 may be formed on opposing sides of each gate stack 104. Thus, as illustrated by FIGS. 1A through 1D, various embodiment devices can have any number of interfacial and/or spacer layers formed on opposing sides of a gate stack. These layers include a low-k dielectric spacer 108 and at least one high-selectivity spacer formed between the low-k dielectric spacer and source/drain contacts of embodiment devices.

Figure 2:
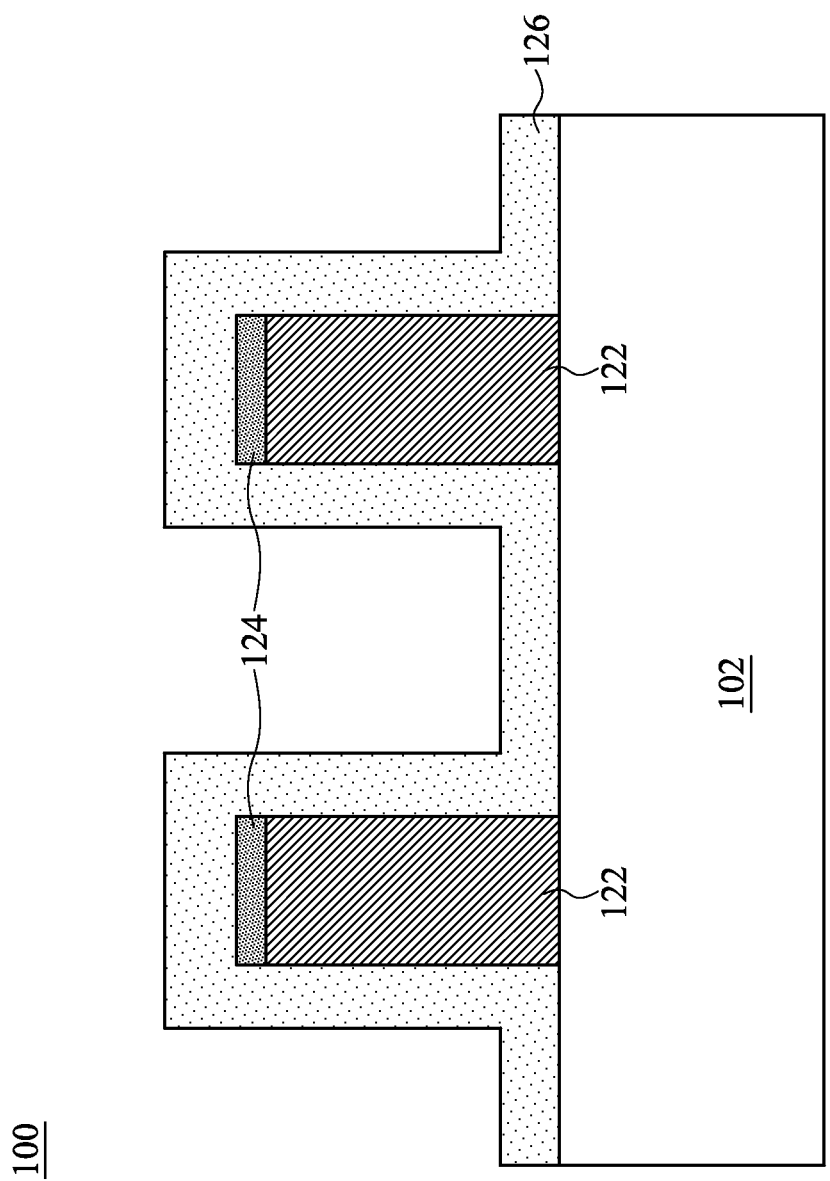
FIGS. 2 through 12 illustrate cross-sectional views of intermediary steps of forming a semiconductor device in accordance with some embodiments.

FIGS. 2 through 12 illustrate cross-sectional views of various intermediary steps of forming device 100 in accordance with some embodiments. Referring first to FIG. 2, there is shown a fin 102 having dummy gate stacks 122 formed thereon. As discussed in greater detail below, dummy gate stacks 122 are sacrificial structures used to align and form source/drain regions 118 and various spacers adjacent to dummy gate stacks 122 and will be replaced by gate stacks 104 (see FIG. 7) in subsequent processing steps.

As such, dummy gate stacks 122 may be formed of any suitable material and processes. In some embodiments, dummy gate stacks 122 may comprise a dummy gate dielectric and a dummy gate electrode (not separately illustrated). A hard mask 124, which may be similar to hard mask 106, is disposed on top surfaces of dummy gate stacks 122.

As further illustrated by FIG. 2, a low-k dielectric layer 126 is formed over fin 102 and dummy gate stacks 122. In an embodiment, low-k dielectric layer 126 is further formed over hard mask 124. Low-k dielectric layer 126 may be formed of a material having a k-value less than about 4.0, for example, by any suitable method, such as chemical vapor deposition (CVD), plasma-enhanced CVD (PECVD), and the like. In an embodiment, low-k dielectric layer 126 comprises phosphosilicate glass (PSG), borophosphosilicate glass (BPSG), fluorinated silicate glass (FSG), $SiO_xC_y$, silicon carbon material, an ELK material (e.g., SiCO, SiCOH), a porous dielectric material, compounds thereof, composites thereof, combinations thereof, or the like. Low-k dielectric layer 126 may or may not comprise air gaps to further lower its k-value. In subsequent process steps low-k dielectric layer 126 is patterned to form low-k dielectric spacers 108 (see FIG. 4).

Figure 3:
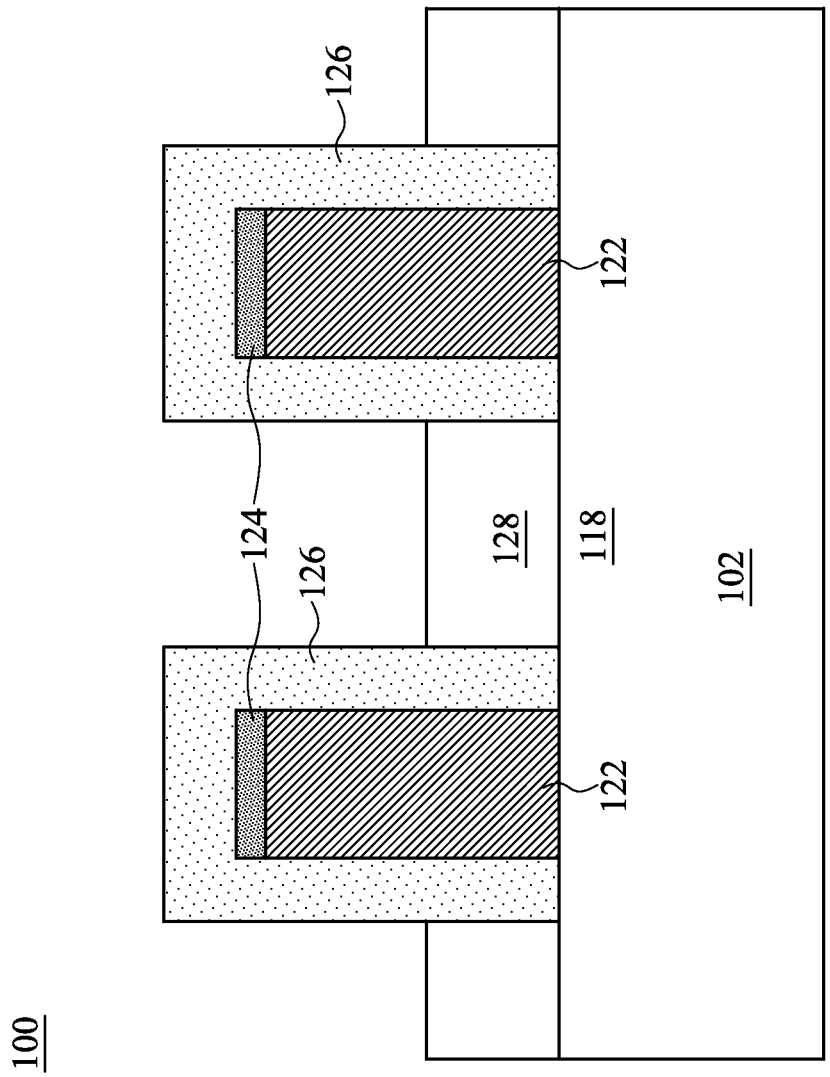

Referring next to FIG. 3, portions of low-k dielectric layer 126 on fin 102 are optionally removed using any suitable process, such as photolithography and etching. Portions of low-k dielectric layer 126 on sidewalls and over a top surface of dummy gate stacks 122 remain. In an embodiment, low-k dielectric layer 126 is patterned to expose fin 102 during a source/drain epitaxy process for forming source/drain regions 118 between dummy gate stacks 122. In another embodiment, low-k dielectric layer 126 is patterned independently of source/drain formation. In another embodiment, low-k dielectric layer 126 remains on a top surface of fin 102. In such embodiments, portions of low-k dielectric layer 126 may remain on a top surface of fin 102 throughout subsequent processing, and a resulting source/drain contact (e.g., contact 116 in FIG. 1B/1C) may extend through low-k dielectric layer 126, which may extend beneath other gate spacers (e.g., spacers 110/112) and ILD 114.

As further illustrated by FIG. 3, a protective layer 128, such as a back-side antireflective coating (BARC) layer is deposited on a top surface of fin 102 between dummy gate stacks 122. Protective layer 128 may be deposited as a blanket layer using any suitable process (e.g., spinning). In an embodiment, protective layer 128 is deposited over hard mask 124, and a planarization, such as a chemical mechanical polish (CMP), is used to expose hard mask 124. Subsequently, protective layer 128 may be patterned (e.g., etched back) to a desired height and to expose sidewalls of low-k dielectric layer 126. Protective layer 128 is used to protect portions of low-k dielectric layer 126 during a subsequent etch back process to form low-k dielectric spacers 108 (see FIG. 4). Thus, a height of protective layer 128 may be correlated to a desired height of the resulting low-k dielectric spacers 108.

Figure 4:
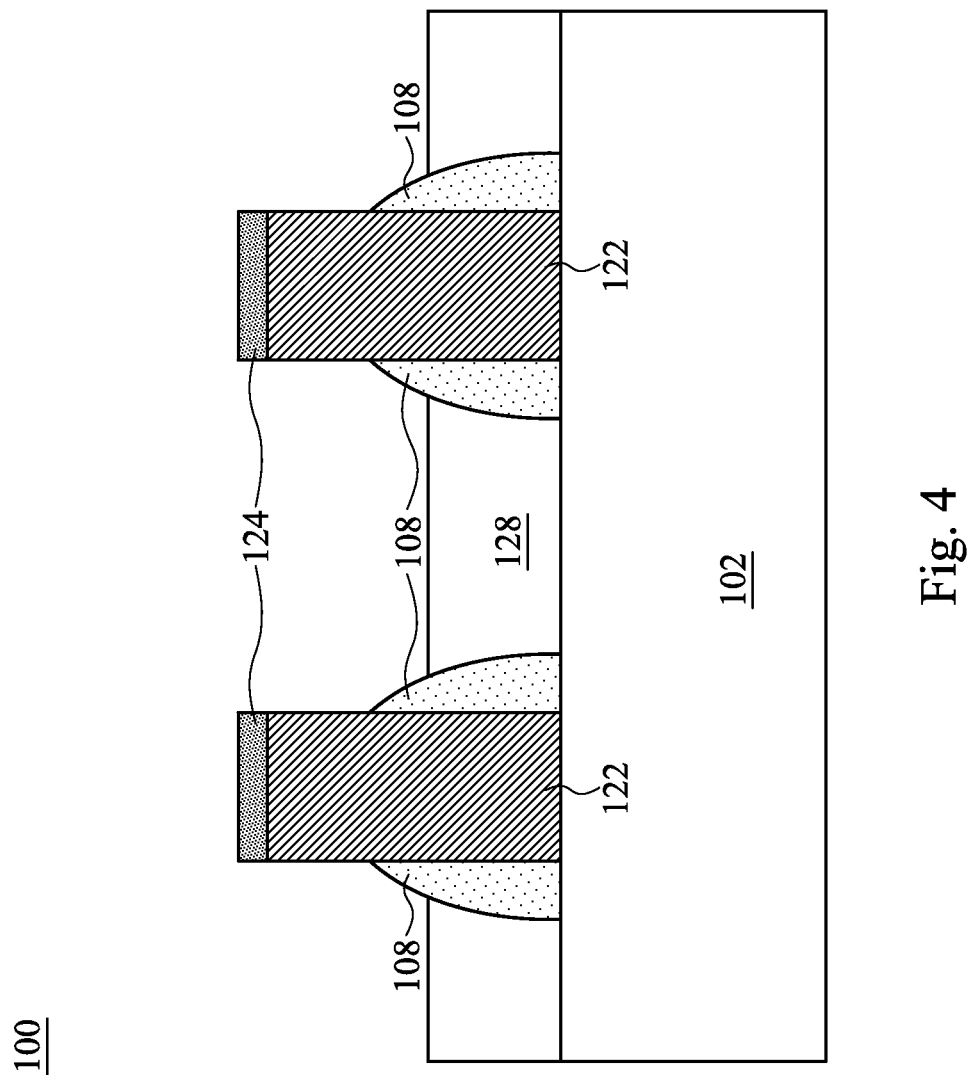

In FIG. 4, portions of low-k dielectric layer 126 disposed above protective layer 128 are removed using a suitable etch back technique. Thus, low-k dielectric spacers 108 are formed on opposing sides of each dummy gate stack 122. During the etching of low-k dielectric layer 126, protective layer 128 may prevent or at least reduce the etching of bottom portions of low-k dielectric layer 126. In some embodiments, the etch back may also etch protective layer 128 at a slower rate, and thus upper portions of protective layer 128 is also removed. As the upper portions of protective layer 128 are removed, a funnel shaped profile may be achieved for tops of low-k dielectric spacers 108. For example, as illustrated by FIG. 4, low-k dielectric spacers 108 have curved sidewalls that taper upwards towards sidewalls of a dummy gate stack 122. In another embodiment, low-k dielectric spacers 108 may have a differently shaped profile depending on the etching process used. For example, sidewalls of low-k dielectric spacers 108 may be substantially straight in another embodiment. Subsequently, protective layer 128 may be removed, for example, by etching. The removal of protective layer 128 may further etch portions of low-k dielectric spacers 108 and further define the funnel shape. The etching process may include a wet or dry etch process using a chemical etchant, which may vary depending on the process and materials etched.

Figure 5:
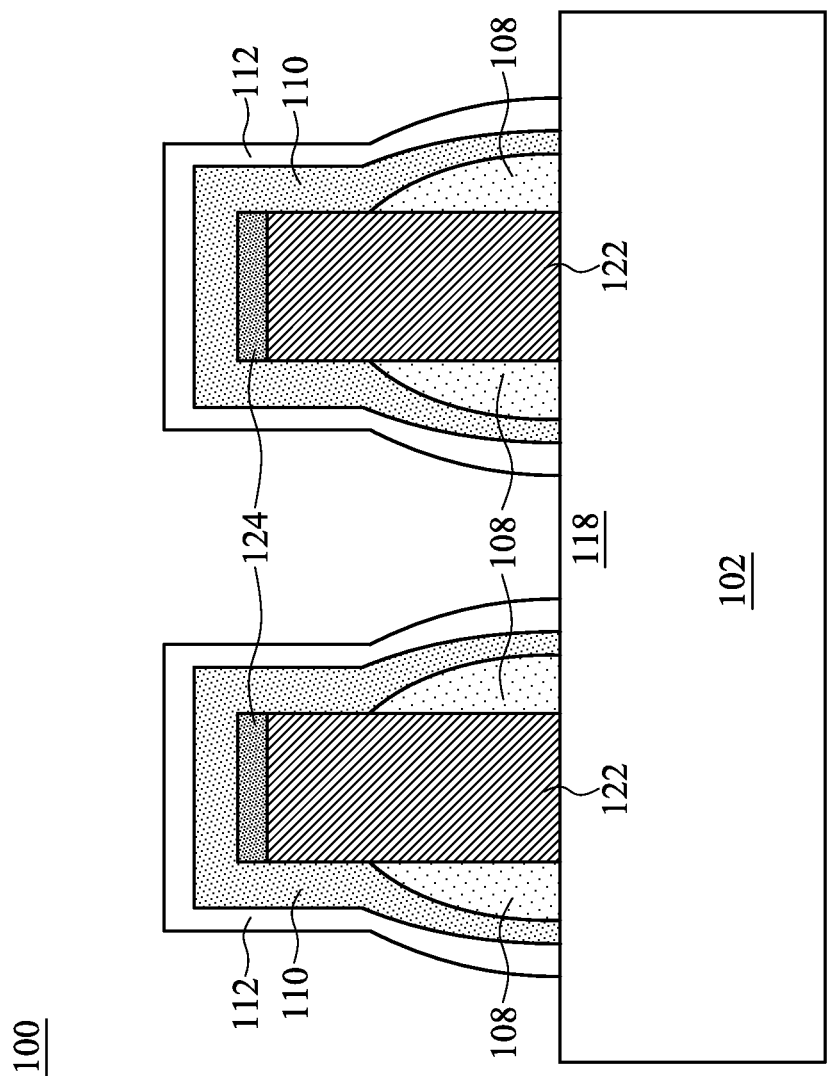

Next, in FIG. 5, additional spacer layers are formed over dummy gate stacks 122, hard masks 124, and low-k dielectric spacers 108. The additional spacer layers include at least one high selectivity spacer layer 110, which may comprise a material that has a higher etch selectivity than low-k dielectric spacer 108. For example, in an embodiment spacer layer 110 comprises silicon nitride, silicon oxide, silicon oxynitride, and the like. Additional spacer layers, such as spacer layer 112 may also be formed, and spacer layer 112 may function as a CESL during the patterning of source/drain contacts. In other embodiments, spacer layer 112 may be omitted. In other embodiments, additional spacer layers and/or interfacial layers may be formed. In various embodiments, the spacer layers (e.g., spacer layers 110 and 112) are formed as conformal layers using any suitable process (e.g., CVD, PECVD, and the like), and an anisotropic etch is used to remove dielectric material of the spacer layers other than that dielectric material adjacent dummy gate stacks 122. For example, as illustrated in FIG. 5, portions of spacer layers 110 and 112 on fin 102 are removed. A mask (e.g., a photoresist and/or hard mask) may be used to mask certain portions of spacer layers 110 and 112 during this etching. In another embodiment, the anisotropic etch may also remove portions of spacer layers 110 and 112 disposed over dummy gates 122. In device 100, low-k dielectric spacers 108 are formed and recessed prior to forming spacer layers 110 and 112. Thus, in various embodiments, spacer layer 110 may be formed on all exposed sidewalls (e.g., the curved sidewalls) of low-k dielectric spacers 108. In subsequent process steps, spacer layers 110 and/or 112 protect low-k dielectric spacers 108 from damage during various etching processes.

Figure 6:
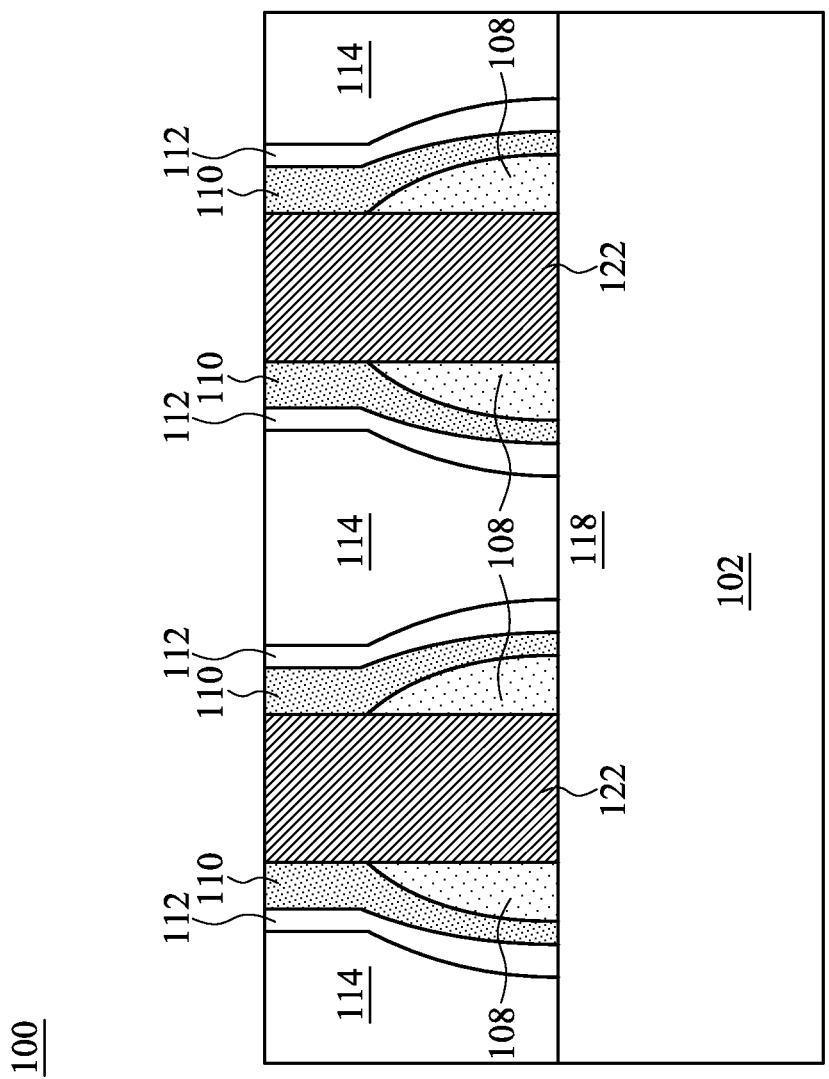

In FIG. 6, ILD 114 is formed between dummy gate stacks 122 and spacer layers 110/112 in accordance with some embodiments. ILD 114 may be formed, for example, of a low-k dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). ILD 114 may comprise a plurality of dielectric layers. ILD 114 may be formed over top surfaces of hard mask 124 and spacer layers 110 and 112 (see FIG. 5). Subsequently, portions of ILD 114 over dummy gate stacks 122 and hard mask 124 are removed, exposing dummy gate stacks 122. In some embodiments, a chemical mechanical polishing (CMP) process is used to planarize an upper surface of ILD 114 level with an upper surface of dummy gate stacks 122 as illustrated in FIG. 6. Upper portions of spacer layers 110 and 112 are also removed during the planarization, forming spacers 110 and 112 on opposing sides of each dummy gate stack 122.

Figure 7:
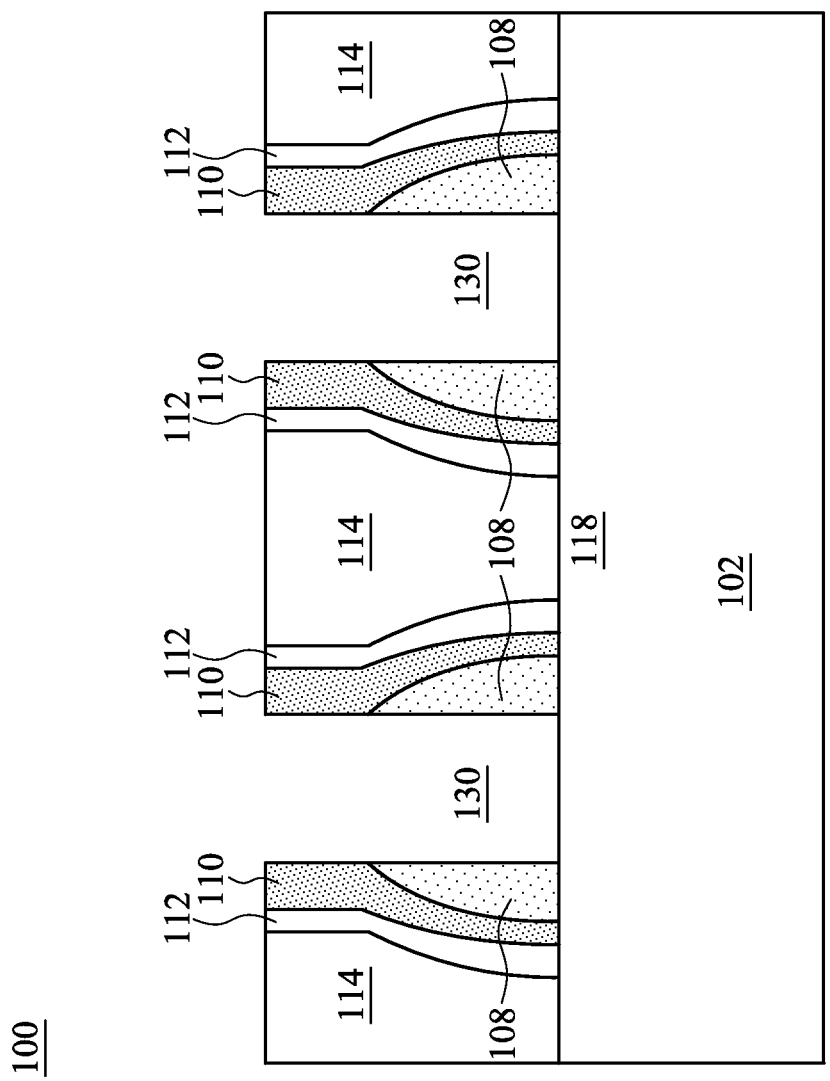

FIG. 7 illustrates the selective removal of dummy gate stacks 122 (see FIG. 6) in accordance with some embodiments. In embodiments in which dummy gate stacks 122 is a polysilicon material, dummy gate stacks 122 may be selectively etched using either dry or wet etching. In the case dry etching is used, the process gas may include $CF_4$, CHF), $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH$:$H_2O_2$:$H_2O$ (APM), $NH_2OH$, KOH, $HNO_3$:$NH_4F$:$H_2O$, and/or the like. Thus, openings 130 are formed between adjacent spacers (e.g., low-k dielectric spacers 108, spacers 110, and spacers 112).

Figure 8:
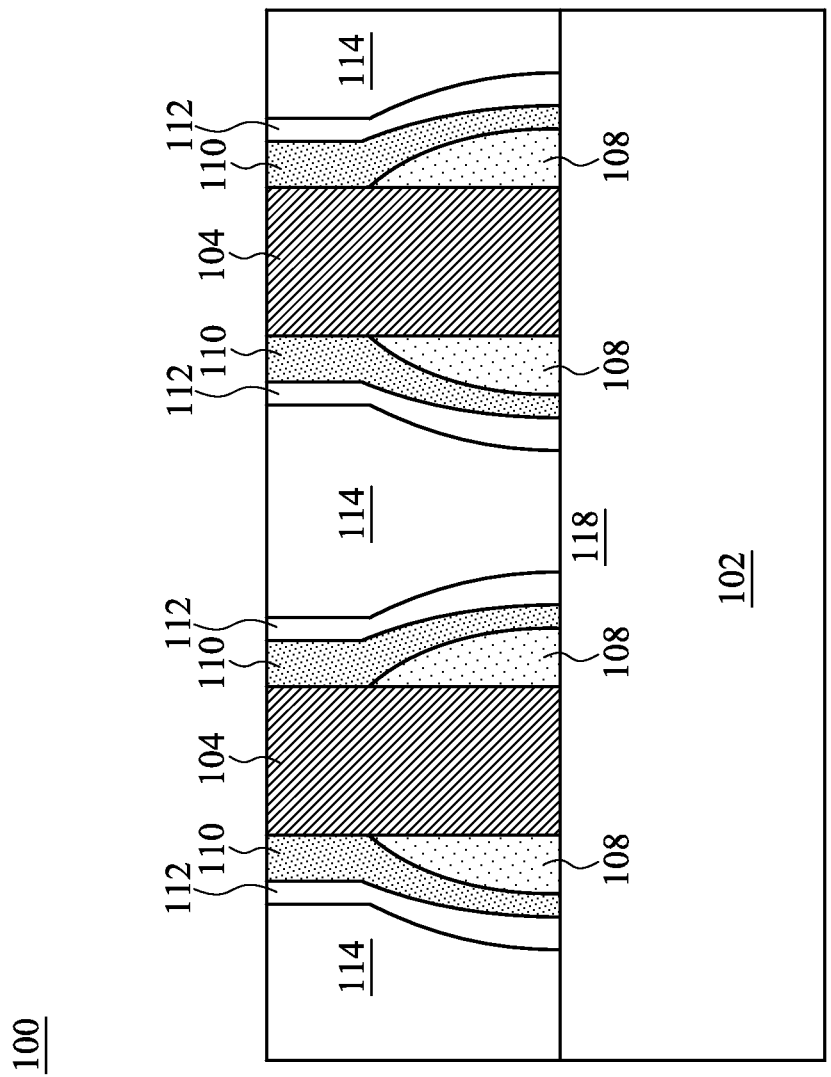

FIG. 8 illustrates the formation of gate stacks 104 in openings 130 between low-k dielectric spacers 108. Gate stacks 104 may comprise various layers, such as, interfacial layers, a gate dielectric, and a gate electrode (not separately illustrated). In such embodiments the interfacial layer may first be formed to wrap around surfaces of fin 102. The interfacial layer helps buffer the substrate and a subsequently formed high-k dielectric layer. In some embodiments, the interfacial layer is a chemical silicon oxide, which may be formed of chemical reactions. For example, a chemical oxide may be formed using deionized water+ozone ($DIO_3$), $NH_4OH$+$H_2O_2$+$H_2O$ (APM), or other methods. Other embodiments may utilize a different material or processes for the interfacial layer. A gate dielectric is formed on the interfacial layer. In an embodiment, the gate dielectric includes one or more high-k dielectric layers (e.g., having a dielectric constant greater than 4.0). For example, the gate dielectric may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, and the like. The formation methods of the gate dielectric include molecular-beam deposition (MBD), atomic layer deposition (ALD), physical vapor deposition (PVD), and the like.

A gate electrode is formed over the gate dielectric. In some embodiments, the gate electrode is formed of tantalum or titanium containing materials such as TaC, TaN, TiN, TaAlN, TaSiN, and combinations thereof. These metal-containing materials may be in the form of metal carbides, metal nitrides, or conductive metal oxides. Other embodiments may utilize other types of metals, such as W, Cu, Ti, Ag, Al, TiAl, TiAlN, TaCN, TaSiN, Mn, WN, Ru, and Zr. The formation methods of the gate electrode include ALD, PVD, metal-organic chemical vapor deposition (MOCVD), and the like. The gate electrode may further include two or more layers for a composite gate structure. For example, the gate electrode may be adjusted to exhibit a work function suitable to the type of device being formed, e.g., a PMOS device or an NMOS device. Generally, it may be desirable to adjust the work function of the gate electrode to the band-edge of the silicon; that is, for an NMOS device, adjusting the work function close to the conduction band, and for a PMOS device, adjusting the work function close to the valence band. In some embodiments, multiple layers may be used to adjust the work function and other operating characteristics of the device. In some embodiments, a planarization (e.g., CMP) may be used to level top surfaces of gate stacks 104 with ILD 114.

Figure 9:
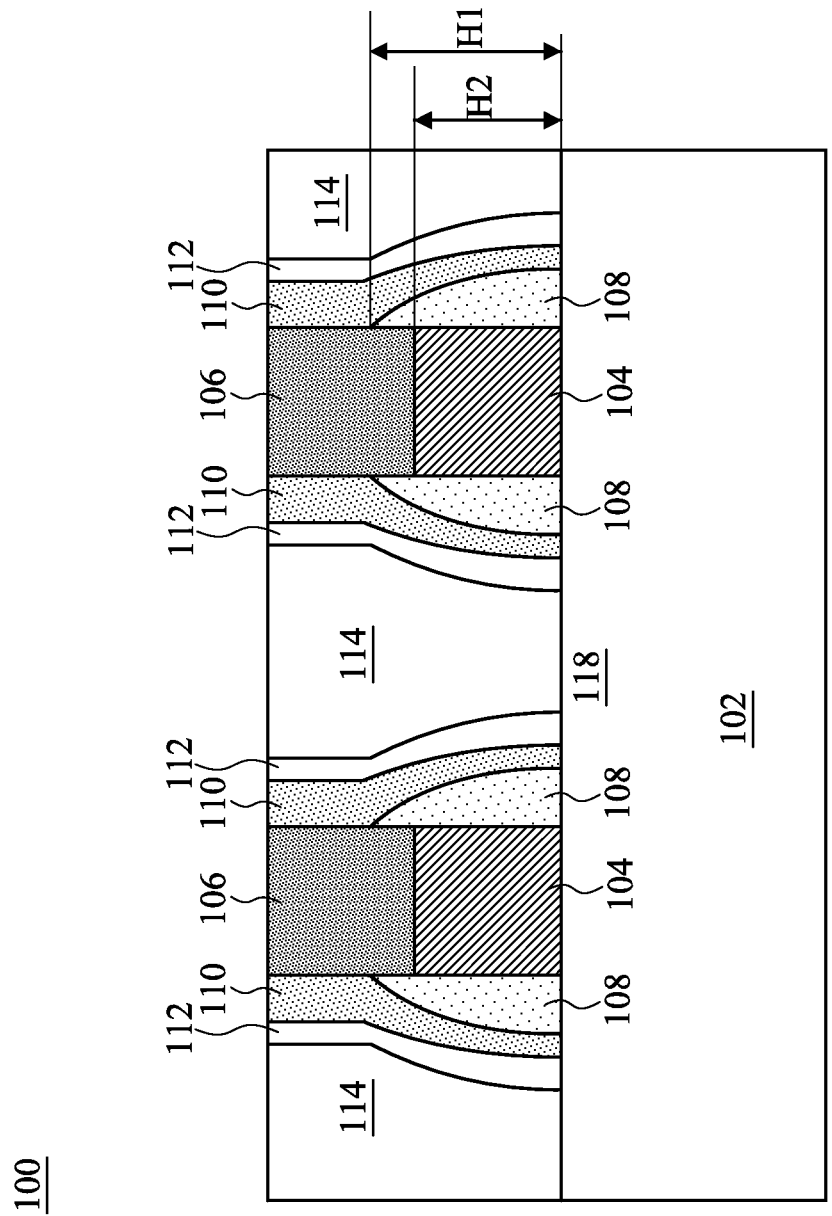

In FIG. 9, a recessing is performed to remove upper portions of gate stacks 104. In some embodiments, each gate stack 104 is recessed to have a vertical dimension H2 over fin 102. The value of dimension H2 may be related to a vertical dimension H1 of low-k dielectric spacers 108. For example, in some embodiments dimension H1 may be about 95% to about 105% of dimension H2. It has been observed that when the vertical dimensions of gate stacks 104 and low-k dielectric spacers 108 are within this range, advantageous reductions in parasitic capacitance may be achieved while also reducing damage to low-k dielectric spacer 108 during subsequent processing (e.g., etching of ILD 114 for source/drain contacts 116).

Figure 10:
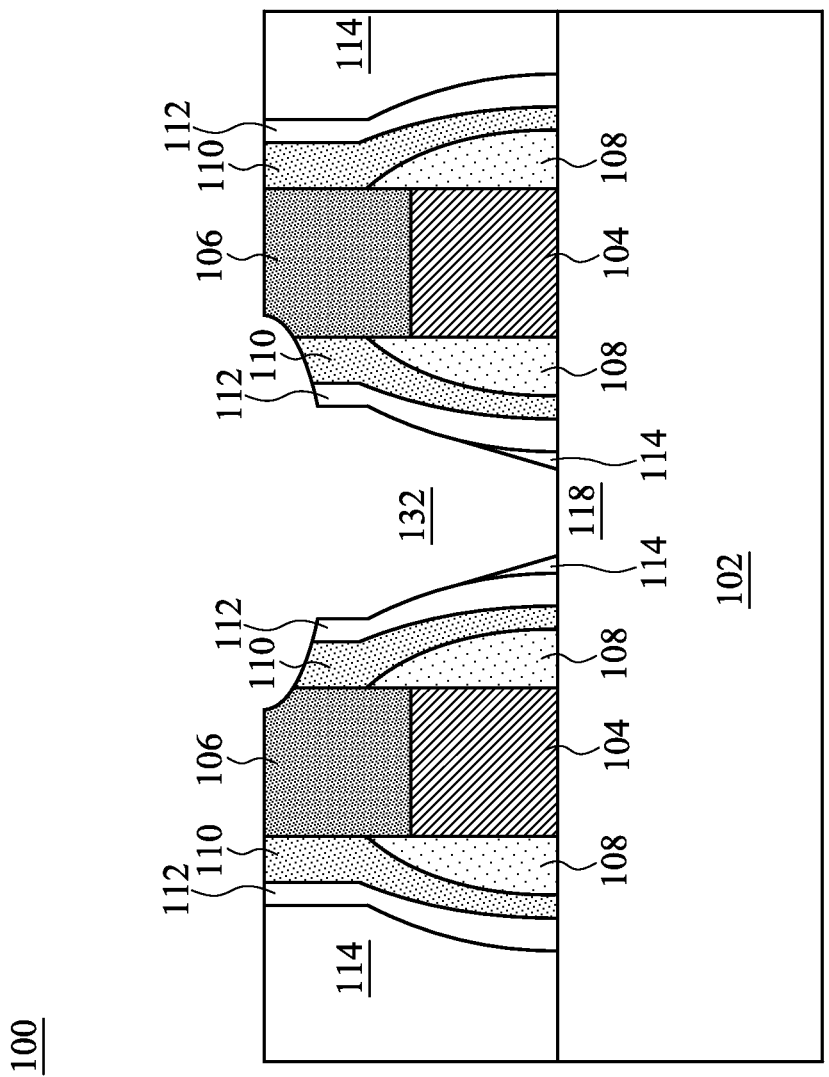

In FIG. 10, a contact opening 132 in patterned extending through ILD 114 to expose source/drain region 118. Opening 132 is patterned using a combination of photolithography and etching. For example, a photoresist (not shown) may be deposited over ILD. The photoresist may be deposited as a blanket layer ILD 114 Next, portions of the photoresist may be exposed using a lithography mask (not shown). Exposed or unexposed portions of the photoresist are then removed depending on whether a negative or positive resist is used. The resulting patterned photoresist may include an opening, which is used to define a shape of opening 132.

The pattern of the photoresist may optionally be transferred to a hard mask (not shown) formed over ILD 114 using a suitable etching process, for example. The hard mask is then used to etch underlying ILD 114. After etching, the photoresist and optional hard mask are removed using any suitable process(es). For example, the photoresist may be removed a plasma ashing or wet strip process. Optionally, the plasma ashing process may be followed by a wet dip in a sulfuric acid ($H_2SO_4$) solution to clean device 200 and remove remaining photoresist material.

Due to the close dimension of adjacent gate stacks 104 in device 100, etching opening 132 may further etch hard mask 106, spacer 112, and spacer 110. In various embodiments, the etching process may include using a chemical etchant (e.g., a fluorocarbon) that etches ILD 114 at a faster rate than spacers 112 (e.g., a CESL), spacers, 110 (e.g., a high selectivity spacer), and hard mask 106. Due to this difference in etching rate, opening 132 may extend through ILD 114 and expose source/drain region 118 without etching gate stacks 104 or low-k dielectric spacer 108, which underlie hard mask 106, spacer 112, and spacer 110. Thus, hard mask 106, spacer 110, and spacer 112 may be used as protective layers to prevent (or at least reduce) damage to gate stacks 104 and low-k dielectric spacers 108 during the patterning of opening 132. Although FIG. 10 illustrates only one contact opening 132 being formed in 114, any number of contact openings 132 may be formed simultaneously.

Figure 11:
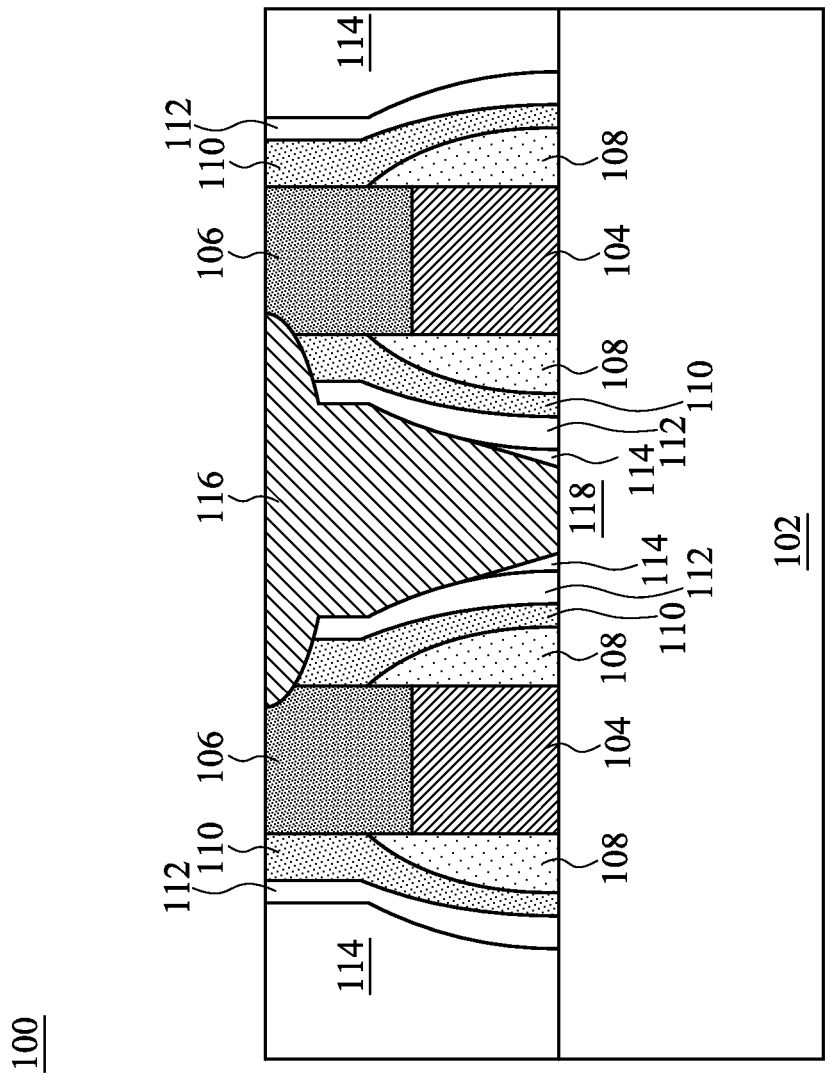
Figure 12:
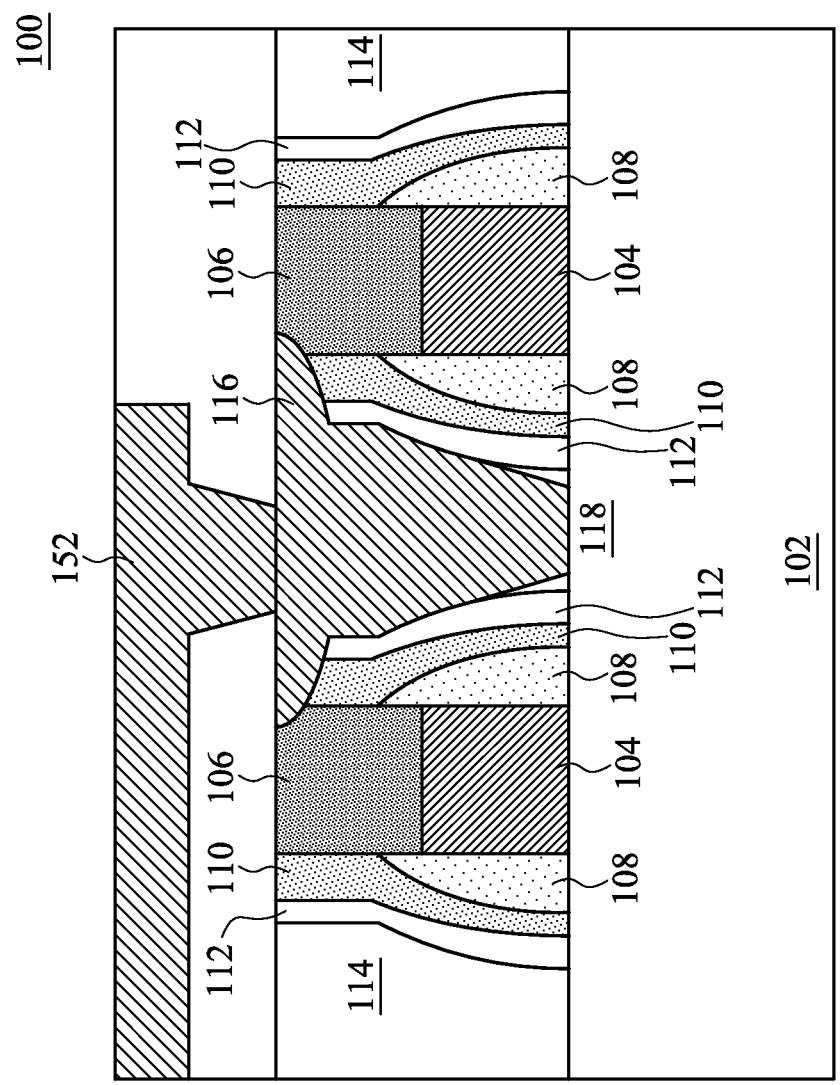

Next, as illustrated by FIG. 11, opening 132 may be filled with a conductive material such as, tungsten, aluminum, copper, gold, silver, alloys thereof, combinations thereof, and the like to form contact 116 electrically connected to underlying source/drain region 118. The formation of contact 116 may also include first depositing a diffusion barrier layer (not shown) on a bottom surface and sidewalls of opening 132. For example, the barrier layer may comprise titanium nitride, titanium oxide, tantalum nitride, tantalum oxide, and the like, and barrier layer may be formed to reduce diffusion of the conductive material of contact 116 into the surrounding dielectric material of ILD 114. The formation of the barrier layer and contact 116 may overflow opening 132, and a planarization process (e.g., CMP) may be performed to remove excess conductive material from device 100. In some embodiments, a seed layer (not illustrated) may also be formed prior to the formation of contact 116, and forming contact 116 may include an electroless plating process using the seed layer.

Subsequently, additional dielectric layers, such as inter-metal dielectric (IMD) layer 150 may be formed over ILD 114. IMD 150 may include conductive features formed therein, such as conductive feature 152. Conductive feature 152 electrically connects contact 116 to additional interconnect structures and input/output features of device 100. Conductive feature 152 may further include a metal line that may be used for electrical routing and to form functional circuits within device 100. Thus, various spacers and source/drain contacts may be formed adjacent gate stacks 104 in device 100.

Figure 13A:
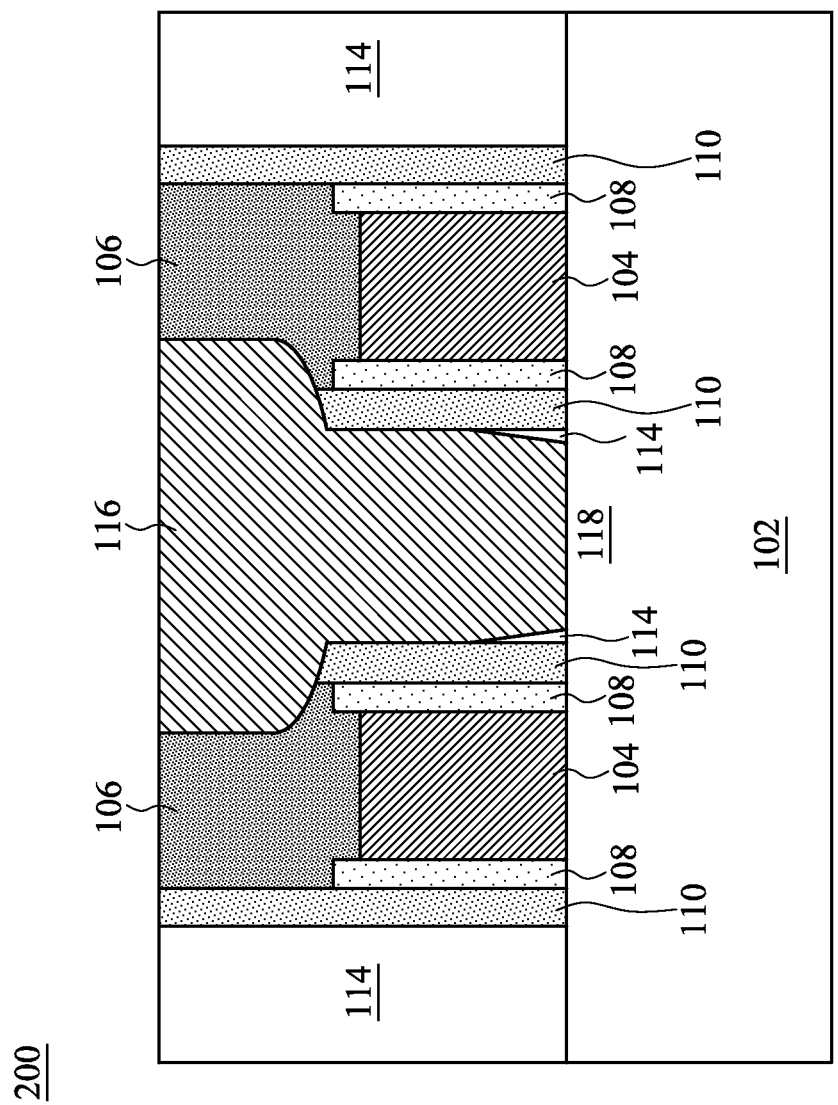
FIGS. 13A and 13B illustrate cross-sectional views of semiconductor devices in accordance with some alternative embodiments.
Figure 13B:
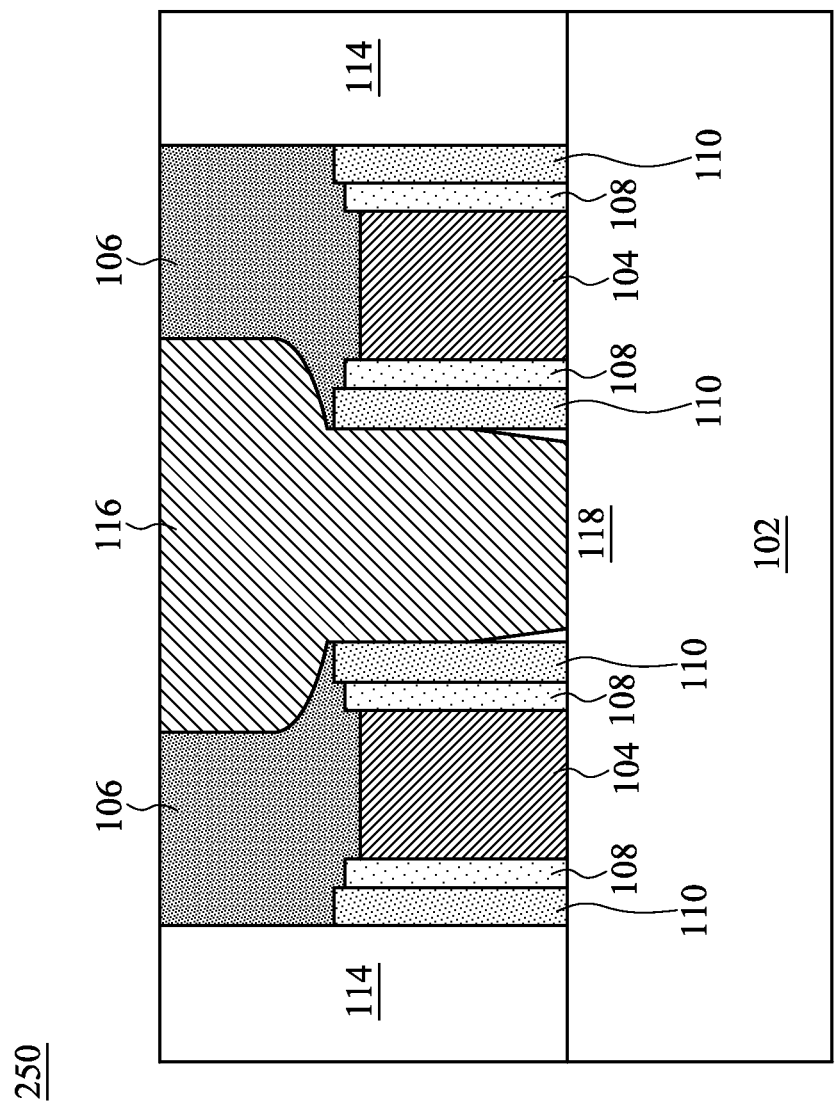

FIGS. 13A and 13B illustrate cross-sectional views of semiconductor devices 200 and 250, respectively, in accordance with other embodiments. Devices 200 and 250 may be substantially similar to device 100 where like reference numerals indicate like elements. Referring first to FIG. 13A, in forming device 200, low-k dielectric spacers 108 are recessed after spacers 110 are formed. Thus, spacers 110 are formed adjacent low-k dielectric spacers 108, but spacers 110 do not cover tops of low-k dielectric spacers 108. Instead, hard mask 106 is used to cover and protect tops of low-k dielectric spacers 108. As discussed above, hard mask 106 may also comprise a material having a higher etch selectivity, such as silicon nitride, silicon oxide, silicon oxynitride, and the like. Thus, in device 200, hard mask 106 is used to protect low-k dielectric spacers 108 from damage during the formation of contact 116. In an embodiment, spacer 110 may also be recessed from top surfaces of ILD 114 and hard mask 106 (see FIG. 13B). In such embodiments, hard mask 106 may further cover top surfaces of spacers 110. Furthermore, although not explicitly illustrated, devices 200 and 250 may also include additional interfacial and/or spacer layers as described above.

Figure 14:
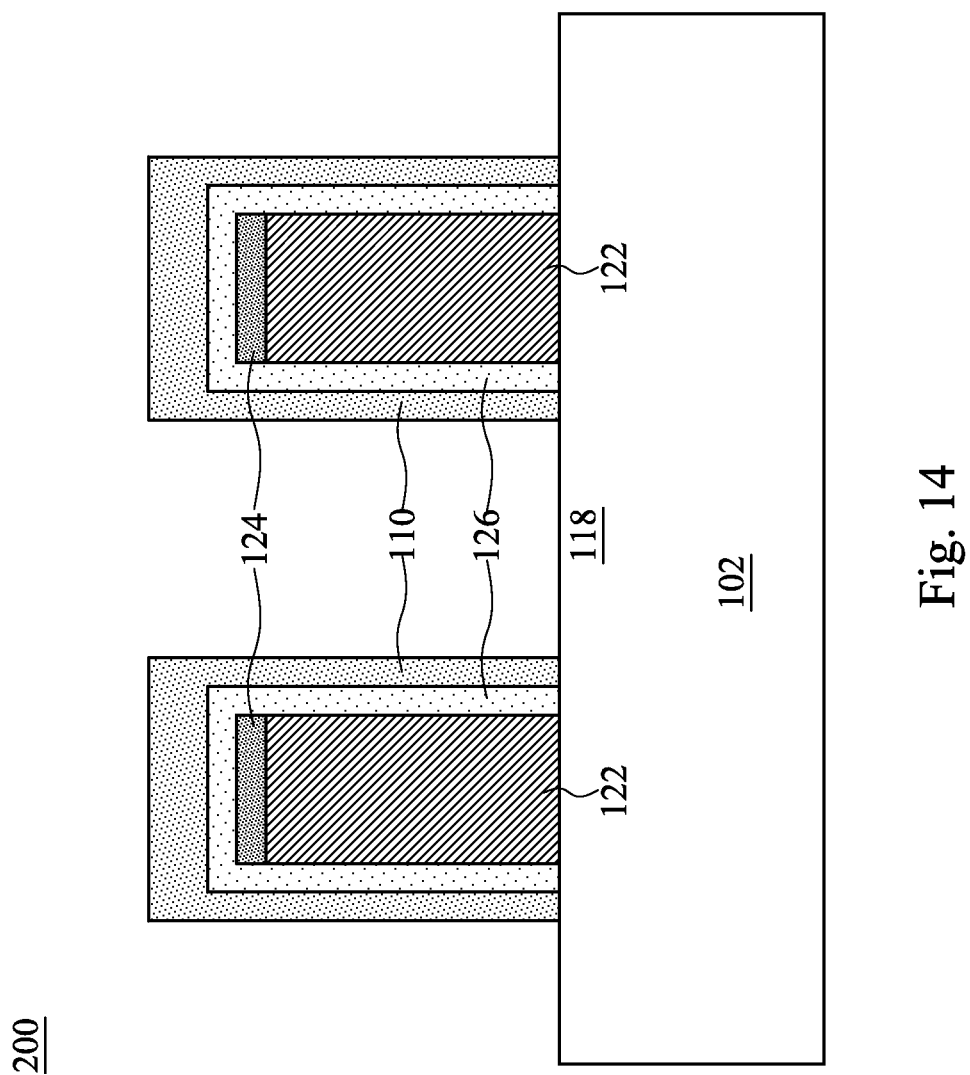
FIGS. 14 through 21 illustrate cross-sectional views of intermediary steps of forming a semiconductor device in accordance with some alternative embodiments.

FIGS. 14 through 21 illustrate cross-sectional views of various intermediary steps of forming device 200 in accordance with an embodiment. In FIG. 14, there is shown a fin 102 having dummy gate stacks 122 formed thereon. A hard mask 124 is formed on top surfaces of dummy gate stacks 122. A low-k dielectric layer 126 is formed over fin 102 and dummy gate stacks 122, and a spacer layer 110 is formed over low-k dielectric layer 126. The formation and composition of layers 126 and 110 may be similar to device 100 as described above. Namely, low-k dielectric layer 126 comprises a low-k dielectric material having a k-value less than about 4.0 while spacer layer 110 may comprise a relatively high etch selectivity material. For example, low-k dielectric layer 126 may comprise a low-k material having a k-value less than about 4.0 while spacer layer 110 comprises a material having a higher dielectric constant, such as silicon nitride, silicon oxide, silicon oxynitride, and the like. Unlike device 100, in device 200, spacer layer 110 is formed prior to, not after, the recessing of low-k dielectric layer 126 to form low-k dielectric spacers 108.

Portions of low-k dielectric layer 126 and spacer layer 110 on fin 102 are optionally removed using any suitable process, such as photolithography and etching. Portions of low-k dielectric layer 126 and spacer layer 110 on sidewalls and over a top surface of dummy gate stacks 122 remain. In an embodiment, low-k dielectric layer 126 and spacer layer 110 are patterned to expose fin 102 during a source/drain epitaxy process for forming source/drain regions 118 between dummy gate stacks 122. In another embodiment, low-k dielectric layer 126 and spacer layer 110 are patterned independently of source/drain formation. In another embodiment, low-k dielectric layer 126 and spacer layer 110 remain on a top surface of fin 102.

Figure 15:
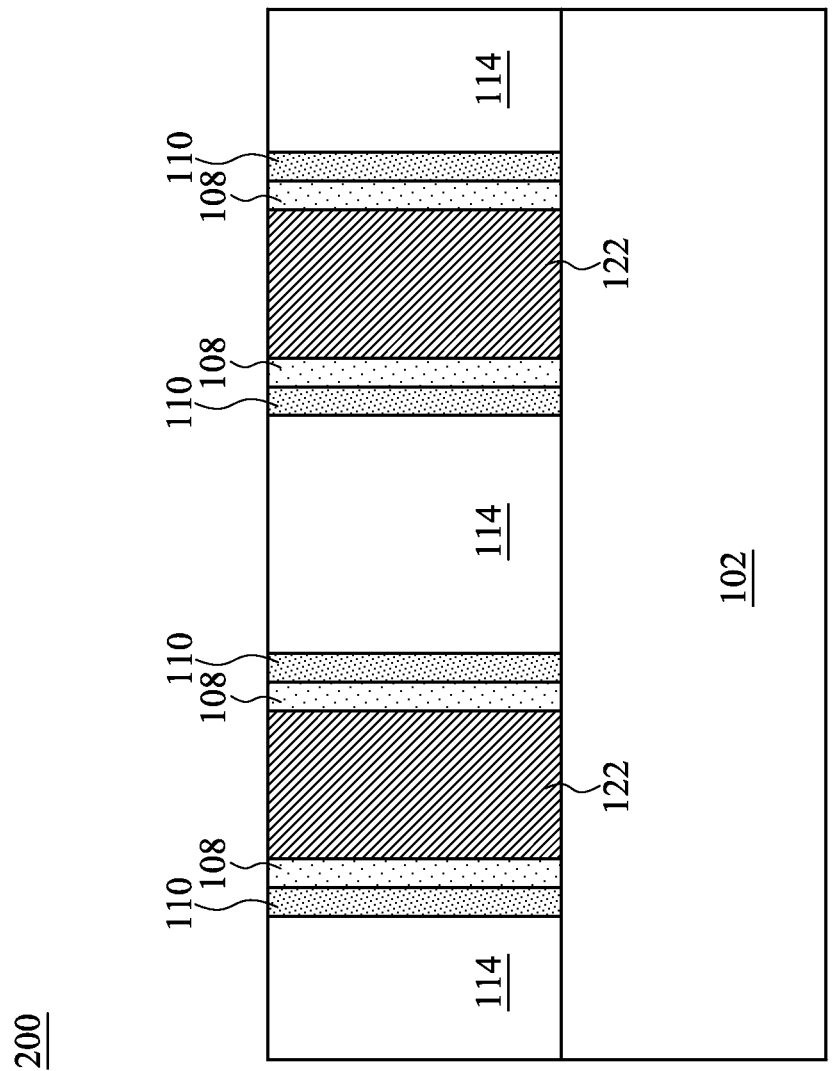

In FIG. 15, ILD 114 is formed between dummy gate stacks 122. ILD 114 may be formed as described above. ILD 114 may be formed over top surfaces of hard mask 124 and spacer layer 110 (see FIG. 14). Subsequently, portions of ILD 114 over dummy gate stacks 122 and hard mask 124 are planarized, exposing dummy gate stacks 122 as described above. Upper portions of low-k dielectric layer 126 and spacer layer 110 are also removed during the planarization of ILD 114, forming low-k dielectric spacers 108 and spacers 110 on opposing sides of each dummy gate stack 122. In an embodiment, spacers 110 are disposed between low-k dielectric spacers 108 and ILD 114.

Figure 16:
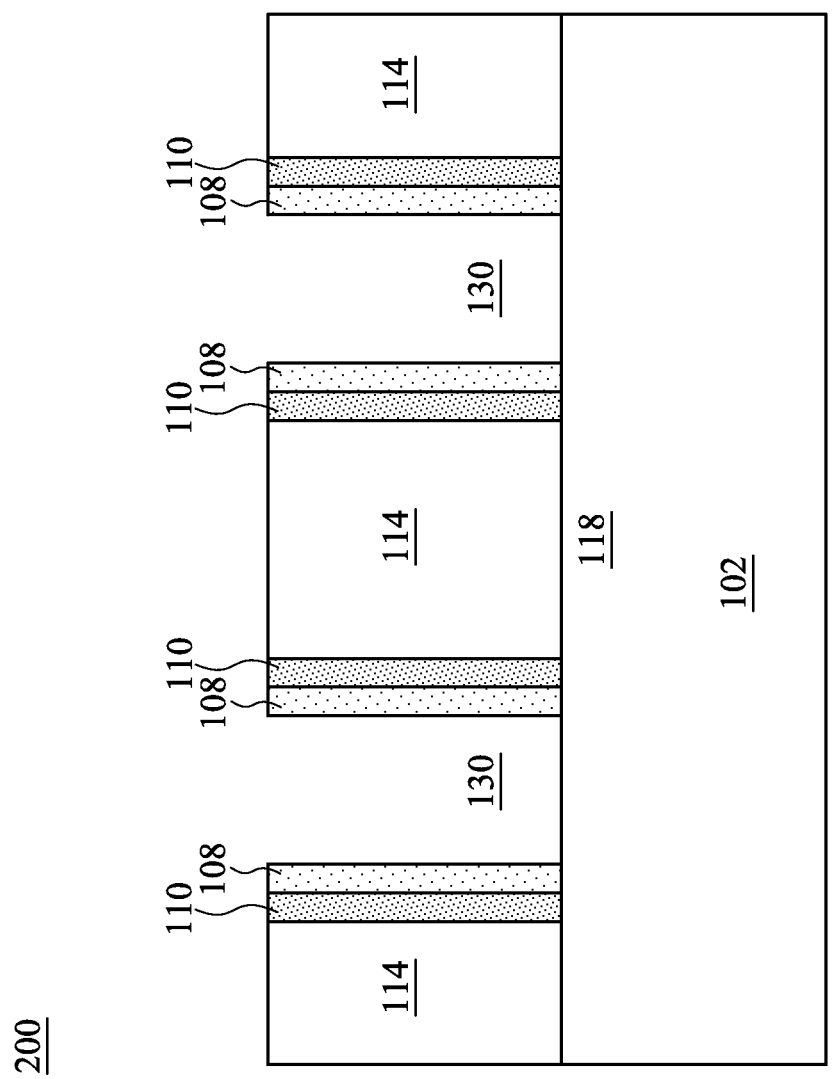

FIG. 16 illustrates the selective removal of dummy gate stacks 122 (see FIG. 6) using a similar method as described above. The removal of dummy gate stacks 122 forms openings 130 between adjacent spacers (e.g., low-k dielectric spacers 108 and spacers 110) in device 200.

Figure 17:
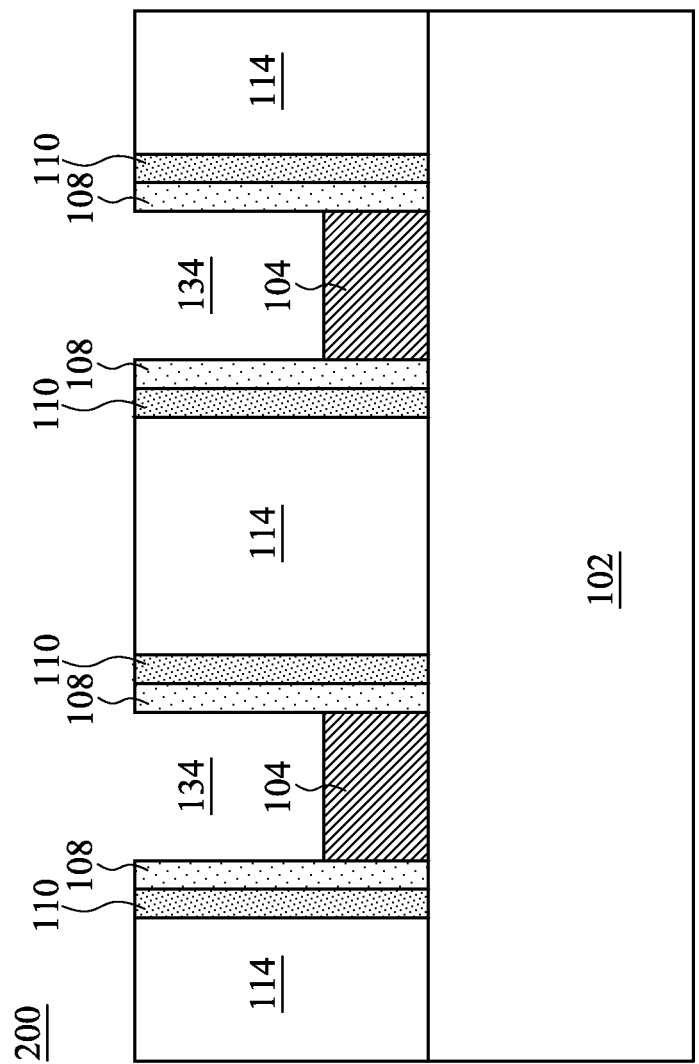

FIG. 17 illustrates the formation of gate stacks 104 in openings 130 between low-k dielectric spacers 108. Gate stacks 104 may comprise various layers, such as, interfacial layers, a gate dielectric, and a gate electrode (not separate illustrated) as described above. As further illustrated by FIG. 17, a recessing is performed to remove upper portions of gate stacks 104. Thus, openings 134 are formed between adjacent low-k dielectric spacers 108 over gate stacks 104.

Figure 18:
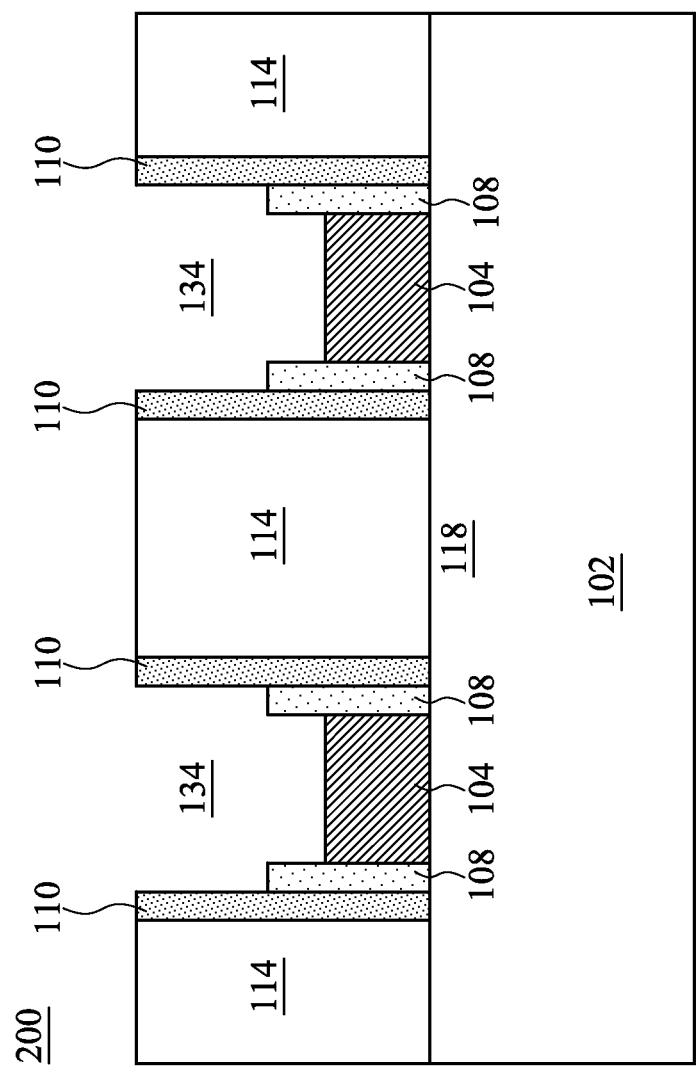

In FIG. 18, low-k dielectric spacers 108 are recessed in openings 134 using a similar process as described above. Although low-k dielectric spacers 108 are illustrated as having substantially straight sidewalls in FIG. 18, low-k dielectric spacers 108 may have a different profile (e.g., a curved profile as described above) in another embodiment depending on the etching process used. During etching, a BARC layer (not shown) may be deposited to protect bottom portions of low-k dielectric spacers 108. In another embodiment, a dummy polysilicon gate, gate stack 104, another material, or a combination thereof may be used to protect bottom portions of low-k dielectric spacers 108 during etching.

After recessing, tops of low-k dielectric spacers 108 may be lower than a top surface of ILD 114. In some embodiments, vertical dimension H1 of low-k dielectric spacers 108 may be about 95% to about 105% of vertical dimension H2 of gate stack 104. It has been observed that when the vertical dimensions of gate stacks 104 and low-k dielectric spacers 108 are within this range, advantageous reductions in parasitic capacitance may be achieved while also reducing damage to low-k dielectric spacer 108 during subsequent processing (e.g., etching of ILD 114 for source/drain contacts 116).

In some embodiments (e.g., see FIG. 12B), spacers 110 may further also recessed using an etching process, for example. In such embodiments, etching spacers 110 may be performed using different process conditions (e.g., using different chemical etchants) than those used for recessing low-k dielectric spacers 108. In such embodiments, tops of spacers 110 may be higher than low-k dielectric spacers 108 even after recessing. In an embodiment, tops of spacers 110 may be at least as high as tops of low-k dielectric spacers 108 to provide protection to sidewalls of low-k dielectric spacers 108.

Figure 19:
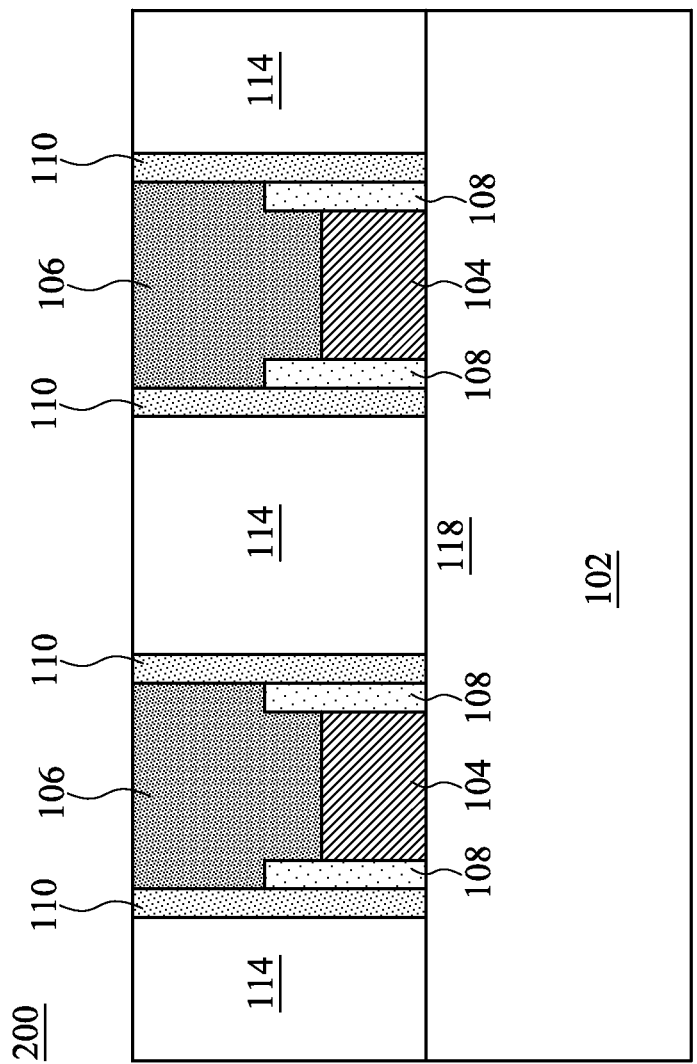
Figure 20:
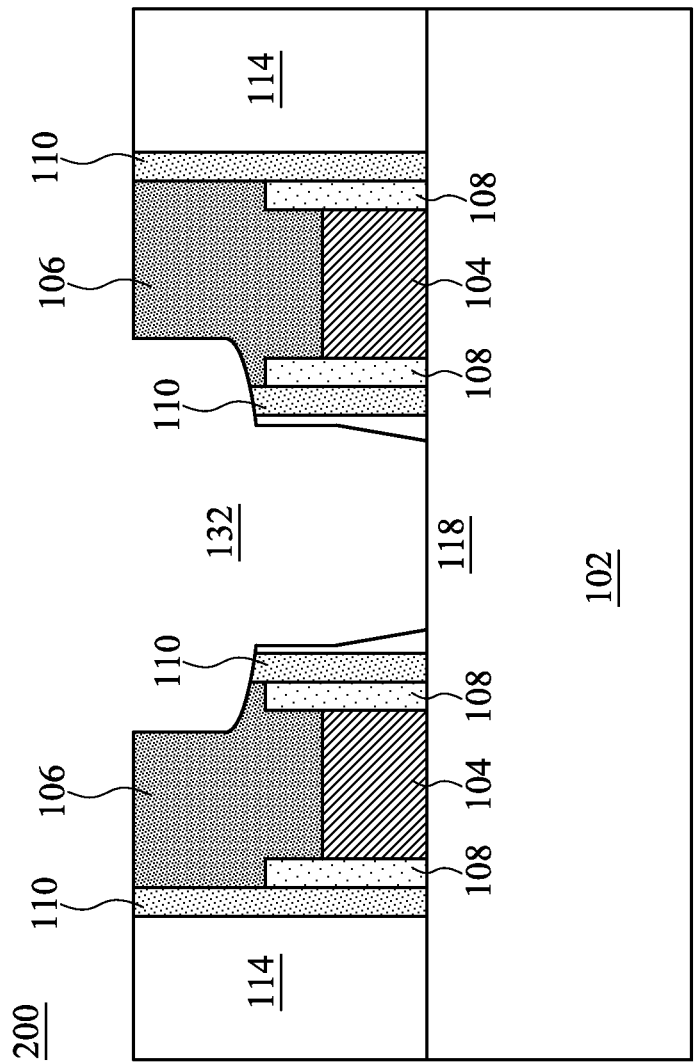

In FIG. 19, hard mask 106 is formed in openings 134 (see FIG. 20). Hard mask 106 may be formed as described above, and hard mask 106 may be formed to cover top surfaces of low-k dielectric spacers 108 and gate stacks 104. In embodiments where spacers 110 are also recessed (e.g., see FIG. 12B), hard mask 106 may be formed on top surfaces of spacers 110 as well. Hard mask 106 may comprise a material having a greater etch selectivity than low-k dielectric spacers 108. Hard mask 106 may or may not comprise a same material as spacers 110.

Next, in FIG. 20, a contact opening 132 in patterned extending through ILD 114 to expose source/drain region 118 as described above. In various embodiments, the etching of opening 132 may include using a chemical etchant (e.g., a fluorocarbon) that etches ILD 114 at a faster rate than spacers 110 and hard mask 106. Due to this difference in etching rate, opening 132 may extend through ILD 114 and expose source/drain region 118 without etching gate stacks 104 or low-k dielectric spacer 108, which underlie hard mask 106 and spacer 110. Thus, hard mask 106 and spacer 110 may be used as protective layers to prevent (or at least reduce) damage to gate stacks 104 and low-k dielectric spacers 108 during the patterning of opening 132.

Figure 21:
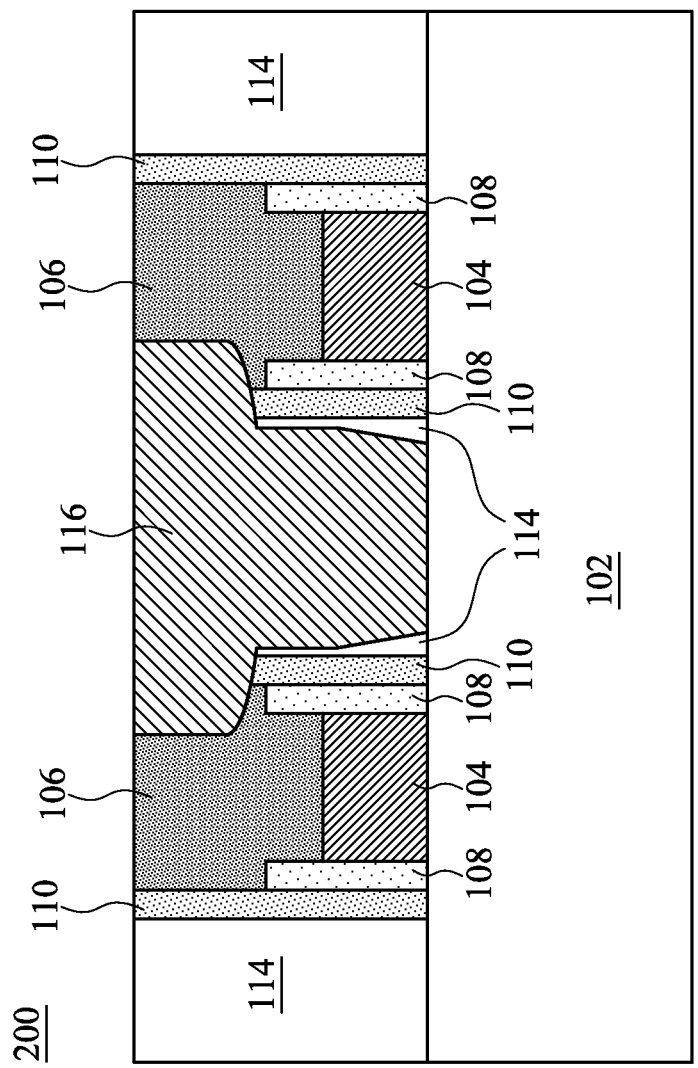

Next, as illustrated by FIG. 21, opening 132 may be filled with a conductive material such as, tungsten, aluminum, copper, gold, silver, alloys thereof, combinations thereof, and the like to form contact 116 electrically connected to underlying source/drain region 118 as described above Thus, various spacers and source/drain contacts may be formed adjacent gate stacks 104 in device 200 where low-k dielectric spacers are recessed after the formation of other spacers 110.

Figure 22:
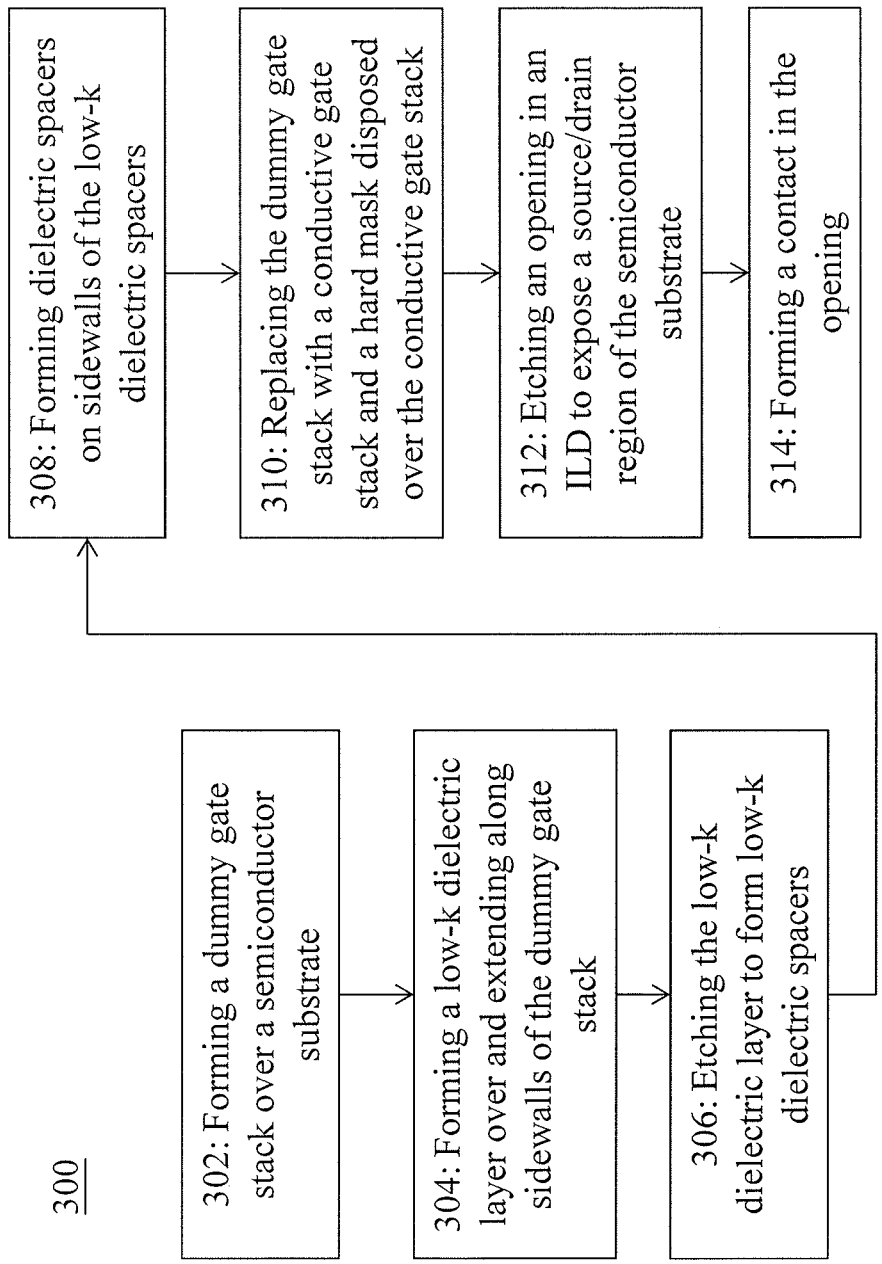
FIG. 22 illustrate an example process flow for forming a semiconductor device in accordance with some embodiments.

FIG. 22 illustrates a process flow 300 for forming gate spacers in accordance with various embodiments. In step 302, a dummy gate stack (e.g., dummy gate stack 122 is formed over a semiconductor substrate (e.g., fin 102, which is part of an underlying substrate). Next, in step 304, a low-k dielectric layer (e.g., low-k dielectric layer 126) is formed over and extending along sidewalls of the dummy gate stack. In step 306, the low-k dielectric layer is etched to formed low-k dielectric spaces (e.g., spacers 108) on opposing sides of the dummy gate stack.

In step 308, additional dielectric spacers (e.g., spacers 110) are formed on sidewalls of the low-k dielectric spacers. In some embodiments, forming the dielectric spacers includes depositing a dielectric spacer layer (e.g., spacer layer 110) after the low-k dielectric layer is etched to form low-k dielectric spacers. In other embodiments, forming the dielectric spacers includes depositing the dielectric spacer layer prior to etching the low-k dielectric layer to form low-k dielectric spacers. In either embodiment, upper portions of the dielectric layer are then removed to form dielectric spacers on sidewalls of the low-k dielectric spacers.

In step 310, the dummy gate is replaced with a conductive gate stack (e.g., gate stack 104) and a hard mask (e.g., had mask 106) on a top surface of the conductive gate stack. In step 312, an opening (e.g., opening 132) is etched in an ILD (e.g., ILD 114) surrounding the conductive gate stacks. The opening may expose source/drain regions in the semiconductor substrate. In some embodiments, etching the openings may further etch the hard mask and the dielectric spacers, which protect the low-k dielectric spacers and the conductive gate stack from damage during the etching of the opening. In step 314, a contact (e.g., contact 116) is formed in the opening.

Various embodiments include gate spacers on opposing sides of a conductive gate stack and source/drain contacts adjacent the gate spacers. The gate spacers include low-k dielectric spacers that advantageously reduce parasitic capacitance between the conductive gate stack and the source/drain contacts. A hard mask is formed over the conductive gate stack. The low-k dielectric spacers are recessed below the hard mask, and in some embodiments, the hard mask may further be formed on a top of the low-k dielectric spacers. Additional dielectric material (e.g., additional gate spacers) may be formed on sidewalls of the low-k dielectric spacer. The hard mask and the additional dielectric material protect the low-k dielectric spacers and the conductive gate stacks from etching damage during the formation of the source/drain contacts. Thus, parasitic capacitance and manufacturing defects can be reduced in an embodiment device.

In accordance with an embodiment, a device includes a gate stack extending over a semiconductor substrate, a hard mask disposed on a top surface of the gate stack, and a low-k dielectric spacer on a side of the gate stack. A top of the low-k dielectric spacer is lower than an upper surface of the hard mask. The device further includes a contact electrically connected to a source/drain region adjacent the gate stack. The contact extends laterally over the low-k dielectric spacer, and a dielectric material is disposed between the contact and the low-k dielectric spacer. The dielectric material has a higher selectivity to etching than the low-k dielectric spacer.

In accordance with another embodiment, a device includes a semiconductor substrate comprising a source/drain region, and a gate stack. The gate stack is formed adjacent the source/drain region. The device further includes a hard mask disposed over the gate stack, a source/drain contact electrically connected to the source/drain region, and a low-k dielectric spacer disposed between the source/drain contact and the gate stack. The source/drain contact extends laterally over the low-k dielectric spacer, and a top of the low-k dielectric spacer is lower than the hard mask. A dielectric spacer is at least partially disposed between the low-k dielectric spacer and the source/drain contact, and the dielectric spacer comprises a material having a higher dielectric constant than the low-k dielectric spacer.

In accordance with yet another embodiment, a method includes forming a dummy gate stack over a semiconductor substrate, forming a low-k dielectric layer over and extending along sidewalls of the dummy gate stack, and etching the low-k dielectric layer to form low-k dielectric spacers. Tops of the low-k dielectric spacers are recessed below a top surface of the dummy gate stack. The method further includes forming dielectric spacers on sidewalls of the low-k dielectric spacers, forming an inter-layer dielectric, replacing the dummy gate stack with a conductive gate stack and a hard mask disposed over the conductive gate stack, etching an opening in the ILD to expose a source/drain region of the semiconductor substrate, and forming a contact in the opening. The hard mask and the dielectric spacers protect the low-k dielectric spacers during the etching of the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a gate stack extending over a semiconductor substrate;
   a hard mask disposed on a top surface of the gate stack;
   a pair of low-k dielectric spacers on opposing sides of the gate stack, wherein top surfaces of the pair of low-k dielectric spacers are lower than an upper surface of the hard mask; and
   a contact electrically connected to a source/drain region adjacent to the gate stack, wherein the contact extends laterally over a first low-k dielectric spacer of the pair of low-k dielectric spacers, the first low-k dielectric spacer opposing a second low-k dielectric spacer of the pair of low-k dielectric spacers, wherein a dielectric material of one or more dielectric layers over the first low-k dielectric spacer is disposed between the contact and the first low-k dielectric spacer, wherein top surfaces of one or more dielectric layers over the second low-k dielectric spacer are substantially coplanar with the upper surface of the hard mask, wherein top surfaces of the one or more dielectric layers over the first low-k dielectric spacer are below the upper surface of the hard mask, and wherein the dielectric material has a higher selectivity to etching than material of the first low-k dielectric spacer.

2. The device of claim 1, wherein the one or more dielectric layers over the first low-k dielectric spacer comprise one or more dielectric spacers having a higher selectivity to etching than the first low-k dielectric spacer.

3. The device of claim 2, wherein one of the one or more dielectric spacers covers a sidewall and the top of the first low-k dielectric spacer.

4. The device of claim 2, wherein a top of at least one of the dielectric spacers is lower than the hard mask, and wherein the hard mask is disposed on the top of the at least one of the dielectric spacers.

5. The device of claim 2, wherein a top of at least one of the dielectric spacers is substantially level with a top surface of the hard mask.

6. The device of claim 1, wherein the dielectric material comprises silicon nitride, silicon oxide, silicon oxynitride, or a combination thereof.

7. The device of claim 1, wherein the hard mask is disposed on the top of the first low-k dielectric spacer.

8. The device of claim 1, further comprising an interfacial layer disposed between the gate stack and the contact.

9. A device comprising:
   a semiconductor substrate comprising a source/drain region;
   a gate stack adjacent the source/drain region;
   a hard mask disposed over the gate stack;
   a source/drain contact electrically connected to the source/drain region;
   a pair of low-k dielectric spacers disposed on opposing sidewalls of the gate stack, a first low-k dielectric spacer of the pair of low-k dielectric spacers disposed between the source/drain contact and the gate stack, the first low-k dielectric spacer opposing a second low-k dielectric spacer of the pair of low-k dielectric spacers, wherein the source/drain contact extends laterally over the first low-k dielectric spacer, and wherein a top of the first low-k dielectric spacer is lower than an upper surface of the hard mask; and
   at least a first dielectric spacer that is at least partially disposed between the first low-k dielectric spacer and the source/drain contact, at least a second dielectric spacer that is disposed over the second low-k dielectric spacer, wherein a top surface of the second dielectric spacer is substantially coplanar with the upper surface of the hard mask, wherein a top surface of the first dielectric spacer is lower than the upper surface of the hard mask, and wherein the first dielectric spacer comprises a material having a higher dielectric constant than material of the pair of low-k dielectric spacers.

10. The device of claim 9, wherein the pair of low-k dielectric spacers comprises a first vertical dimension, wherein the gate stack comprises a second vertical dimension over the semiconductor substrate, and wherein the first vertical dimension is about 95% to about 105% of the second vertical dimension.

11. The device of claim 9, wherein the hard mask is disposed on the top of the pair of low-k dielectric spacers.

12. The device of claim 9, wherein the source/drain contact is disposed on surfaces of the hard mask and the first dielectric spacer.

13. The device of claim 9, wherein a top of the first dielectric spacer is lower than the hard mask.

14. A method comprising:
    forming a dummy gate stack over a semiconductor substrate;
    forming a low-k dielectric layer over and extending along sidewalls of the dummy gate stack;
    etching the low-k dielectric layer to form low-k dielectric spacers, wherein tops of the low-k dielectric spacers are recessed below a top surface of the dummy gate stack;
    forming at least one pair of dielectric spacers that are disposed adjacent respective sidewalls of the low-k dielectric spacers;
    forming an interlayer dielectric (ILD) over the semiconductor substrate;
    replacing the dummy gate stack with a conductive gate stack and a hard mask disposed over the conductive gate stack;
    etching an opening in the ILD to expose a source/drain region of the semiconductor substrate, wherein the hard mask and the at least one pair of dielectric spacers protect the low-k dielectric spacers during the etching of the opening; and
    forming a contact in the opening.

15. The method of claim 14, wherein forming the at least one pair of dielectric spacers comprises:
    after etching the low-k dielectric layer, forming a dielectric spacer layer covering exposed surfaces of the low-k dielectric spacers; and
    removing upper portions of the dielectric spacer layer to form the at least one pair of dielectric spacers.

16. The method of claim 14, wherein forming the at least one pair of dielectric spacers comprises:
    prior to the etching the low-k dielectric layer, forming a dielectric spacer layer over and extending along sidewalls of the low-k dielectric layer; and
    removing upper portions of the dielectric spacer layer to expose the low-k dielectric layer to form the at least one pair of dielectric spacers.

17. The method of claim 16, further comprising:
    after exposing the low-k dielectric layer, recessing the at least one pair of dielectric spacers below a top surface of the ILD; and
    forming the hard mask on a top surface of the at least one pair of dielectric spacers.

18. The method of claim 14, wherein etching the opening further comprises etching the hard mask and at least one of the at least one pair of dielectric spacers.

19. The method of claim 14, wherein etching the opening comprises using a chemical etchant that etches the hard mask and the at least one pair of dielectric spacers at a slower rate than the low-k dielectric spacers and the ILD.

20. The method of claim 14, further comprising forming the hard mask on a top surface of the low-k dielectric spacer.

* * * * *